United States Patent
Tanaka et al.

(10) Patent No.: US 8,824,719 B2
(45) Date of Patent: Sep. 2, 2014

(54) MICROPHONE UNIT AND VOICE INPUT DEVICE COMPRISING SAME

(75) Inventors: Fuminori Tanaka, Osaka (JP); Ryusuke Horibe, Osaka (JP); Shuji Umeda, Osaka (JP); Takeshi Inoda, Osaka (JP)

(73) Assignee: Funai Electric Co., Ltd., Osaka (JP)

( * ) Notice: Subject to any disclaimer, the term of this patent is extended or adjusted under 35 U.S.C. 154(b) by 0 days.

(21) Appl. No.: 13/518,515

(22) PCT Filed: Dec. 22, 2010

(86) PCT No.: PCT/JP2010/073116
§ 371 (c)(1),
(2), (4) Date: Jun. 22, 2012

(87) PCT Pub. No.: WO2011/078216
PCT Pub. Date: Jun. 30, 2011

(65) Prior Publication Data
US 2012/0257777 A1  Oct. 11, 2012

(30) Foreign Application Priority Data

Dec. 25, 2009 (JP) .............................. 2009-293989
Jun. 1, 2010 (JP) .............................. 2010-125530

(51) Int. Cl.
*H04R 25/00* (2006.01)
*H04R 19/04* (2006.01)
(Continued)

(52) U.S. Cl.
CPC ............... *H04R 19/04* (2013.01); *H04R 1/406* (2013.01); *H01L 2224/48091* (2013.01); *H01L 2224/48137* (2013.01); *H04R 1/38* (2013.01); *H04R 3/005* (2013.01); *H04R 2499/11* (2013.01); *H01L 2924/10253* (2013.01)
USPC ............................ 381/355; 381/356; 381/369

(58) Field of Classification Search
CPC ........ H04R 19/04; H04R 19/005; H04R 1/08; H04R 1/083; H04R 1/38; H04R 1/342; H04R 3/005; H04R 1/406; H04R 2499/11; H01L 2224/48137

USPC ............ 381/312, 313, 328, 91, 92, 122, 123, 381/355, 356, 357, 358, 361, 369; 438/51; 257/416, 418, 419
See application file for complete search history.

(56) References Cited

U.S. PATENT DOCUMENTS 3,875,349 A * 4/1975 Ruegg ........................... 381/313
5,524,056 A * 6/1996 Killion et al. .................. 381/314
(Continued)

FOREIGN PATENT DOCUMENTS

JP    2004-527177 A    9/2004
JP    2004-537182 A   12/2004
(Continued)

OTHER PUBLICATIONS

International Search Report, prepared by Japanese Patent Office, dated Feb. 1, 2011.

(Continued)

*Primary Examiner* — Huyen D Le
(74) *Attorney, Agent, or Firm* — Amster, Rothstein & Ebenstein, LLP

(57) ABSTRACT

A microphone unit (1) comprises a first vibrating part (14), a second vibrating part (15), and a case (10) for accommodating the first vibrating part (14) and the second vibrating part (15), the case being provided with a first sound hole (132) and a second sound hole (133). The case (10) is provided with a first sound channel (41) for transmitting acoustic pressure inputted from the first sound hole (132) to one surface (142*a*) of a first diaphragm (142) and to one surface (152*a*) of a second diaphragm (152), a second sound channel (42) for transmitting acoustic pressure inputted from the second sound hole (133) to the other surface (152*b*) of the second diaphragm (152), and a sealed space (S) that faces the other surface (142*b*) of the first diaphragm (142).

14 Claims, 17 Drawing Sheets

(51) Int. Cl.
*H04R 1/40* (2006.01)
*H04R 1/38* (2006.01)
*H04R 3/00* (2006.01)

(56) References Cited

U.S. PATENT DOCUMENTS

| | | | |
|---|---|---|---|
| 5,878,147 A * | 3/1999 | Killion et al. | 381/313 |
| 6,075,869 A | 6/2000 | Killion et al. | |
| 2002/0102004 A1 | 8/2002 | Minervini | |
| 2004/0081327 A1 | 4/2004 | Jensen | |
| 2009/0161886 A1 | 6/2009 | Tanaka et al. | |
| 2011/0158449 A1 | 6/2011 | Tanaka et al. | |

FOREIGN PATENT DOCUMENTS

| | | |
|---|---|---|
| JP | 2009-135777 A | 6/2009 |
| JP | 2005-295278 | 3/2014 |
| WO | 2009-099091 A1 | 8/2009 |

OTHER PUBLICATIONS

Extended European Search Report, prepared by European Patent Office, dated Oct. 14, 2013.

Office Action prepared by the State Intellectual Property Office of the People's Republic of China in Chinese Patent Application No. 201080059153.3, dated Jun. 4, 2014.

\* cited by examiner

MICROPHONE UNIT AND VOICE INPUT DEVICE COMPRISING SAME

CROSS-REFERENCE TO RELATED APPLICATIONS

This application is a U.S. national stage entry under 35 U.S.C. §371 of PCT International Application No. PCT/JP2010/073116, filed on Dec. 22, 2010, and claims priority to Japanese Application No. JP 2009-293989, filed on Dec. 25, 2009, and Japanese Application No. JP 2010-125530, filed on Jun. 1, 2010, the contents of which are incorporated herein by reference in their entirety.

TECHNICAL FIELD

The present invention relates to a microphone unit having a function for converting inputted sounds to electrical signals and outputting the electrical signals. The present invention also relates to a voice input device comprising such a microphone unit.

BACKGROUND ART

In conventional practice, microphone units comprising a function for converting inputted sounds to electrical signals and outputting the signals have been applied to various types of voice input devices (for example, mobile telephones, transceivers, and other voice communication devices; voice recognition systems and other information processing systems that use techniques for analyzing inputted voices; audio recording devices; and the like). While a need arises for such microphone units that suppress background noise and pick up only proximal sounds, there is also a demand for such microphone units that pick up not only proximal sounds but distant sounds as well.

A mobile telephone is described hereinbelow as an example of a voice input device comprising a microphone unit. When the mobile telephone is used to make a call, usually the user holds the mobile telephone in their hand and uses the telephone with their mouth near a microphone portion. Therefore, a need commonly arises for the microphone provided to the mobile telephone to have a function for suppressing background noise and picking up only proximal sounds (a function as a close-talking microphone).

However, recent mobile telephones are provided with a hands-free function so that a call can be made while driving an automobile without holding the telephone in hand, for example, and are provided with a function for recording video. In cases in which a mobile telephone is used with the hands-free function, since the position of the mouth of the user is a position separated from the mobile telephone, a need arises that the microphone have a function for picking up not only proximal sounds but distant sounds as well. There is also a need for the microphone to have a function for picking up not only proximal sounds but distant sounds as well also in cases of recording video, because there must be audio recording for the surrounding area when the video is recorded.

Specifically, due to mobile telephones becoming multifunctional in recent years, a need arises for both a function for suppressing background noise and picking up only proximal sounds, and a function for picking up not only proximal sounds but distant sounds as well. To adapt to such a demand, one possibility is to separately install a microphone unit comprising a function as a close-talking microphone, and an omnidirectional microphone unit capable of also picking up distant sounds.

Another possible method is to apply the microphone unit disclosed in Patent Literature 1, for example, to a mobile telephone. The microphone unit disclosed in Patent Literature 1 is designed so that one of two open parts for inputting voice is switched between an open state and a closed state by an opening and closing mechanism. The microphone unit disclosed in Patent Literature 1 functions as a bidirectional differential microphone when the two open parts are open, and functions as an omnidirectional microphone when one of the two open parts is closed.

When the microphone unit functions as a bidirectional differential microphone, it is applied to cases in which the user uses the mobile telephone in hand because the microphone unit can suppress background noise and pick up only proximal sounds. When the microphone unit functions as an omnidirectional microphone, it is applied to cases in which the hands-free function or the video record function is used because it can pick up distant sounds as well.

LIST OF CITATIONS

Patent Literature

Patent Literature 1: Japanese Laid-open Patent Application No. 2009-135777

SUMMARY OF INVENTION

Technical Problem

However, in cases in which a microphone unit comprising a function as a close-talking microphone and an omnidirectional microphone unit are installed separately as described above, the surface area of a mounting substrate for mounting the microphone unit in the mobile telephone must be increased. Since there is a strong demand for mobile telephones to be smaller in recent years, the adaptation of needing to increase the surface area of the mounting substrate for mounting the microphone unit is undesirable.

The configuration of Patent Literature 1 is a configuration that uses a mechanical mechanism to switch between exhibiting the function of a bidirectional differential microphone and exhibiting the function of an omnidirectional microphone. There is concern over the mechanical mechanism's durability because it is weak against impact when dropped and is susceptible to wear.

In view of the above matters, an object of the present invention is to provide a small microphone unit that is readily adapted to making a voice input device multifunctional. Another object of the present invention is to provide a high-quality voice input device comprising such a microphone unit.

Solution to the Problem

To achieve the objects described above, a microphone unit of the present invention comprises a first vibrating part for converting a sound signal to an electrical signal on the basis of vibration of a first diaphragm, a second vibrating part for converting a sound signal to an electrical signal on the basis of vibration of a second diaphragm, and a case for accommodating the first vibrating part and the second vibrating part, the case being provided with a first sound hole and a second sound hole; and the microphone unit is characterized in that the case is provided with a first sound channel for transmitting acoustic pressure inputted from the first sound hole to one surface of the first diaphragm and to one surface of the second diaphragm, a second sound channel for transmitting acoustic pressure inputted from the second sound hole to the other surface of the second diaphragm, and a sealed space that faces the other surface of the first diaphragm.

According to the microphone unit of the present invention, the function of an omnidirectional microphone is obtained, wherein not only proximal sounds but also distant sounds can be picked up using the first vibrating part, and also obtained is the function of a bidirectional differential microphone having excellent distant noise suppression performance using the second vibrating part. Therefore, the microphone unit is readily adapted to imparting multifunctional capabilities to the voice input device (e.g., a mobile telephone or the like) in which the microphone unit is applied. To give a specific example, one possible manner of use is to use the function of a bidirectional differential microphone in the close-talking mode of the mobile telephone, and to use the function of an omnidirectional microphone in the hands-free mode or the video record mode. Since the microphone unit of the present invention has both of these two functions, there is no need to separately install two microphone units, and the size increase of the voice input device is readily minimized.

The microphone unit of the configuration described above may be designed such that the case comprises an installation part for installing the first vibrating part and the second vibrating part, and a lid for forming, together with the installation part, an accommodating space for accommodating the first vibrating part and the second vibrating part, the lid being placed over the installation part; a first open part, a second open part, and a hollow space for communicating the first open part and the second open part are formed in the installation part; the first sound hole, the second sound hole, and a concave space communicating with the first sound hole and forming the accommodating space are formed in the lid; the second vibrating part is disposed in the installation part so as to obscure the first open part; the first sound channel is formed using the first sound hole and the accommodating space; and the second sound channel is formed using the second sound hole, the second open part, the hollow space, and the first open pail.

According to the present configuration, the case constituting the microphone unit is obtained with few members, and the microphone unit is easily made smaller and thinner. According to the present configuration, since the configuration can have two sound holes provided to the same surface, the microphone unit can be applied to a voice input device without complicating the structure of the voice input device.

The microphone unit of the configuration described above may be designed such that the sealed space is formed between the first diaphragm and an installation surface of the installation part on which the first vibrating part is installed.

The microphone unit of the configuration described above may be designed such that the first vibrating part is disposed so as to obscure an open surface of a groove part formed in the installation part, and the groove part is part of the sealed space. According to the present configuration, the capacity is increased in the sealed space (the back chamber) provided to the other surface-side (the surface of the side to which acoustic pressure is not transmitted) of the first diaphragm. Therefore, the microphone sensitivity of the first vibrating part can be improved.

The microphone unit of the configuration described above may be designed such that a through-hole constituting part of the sealed space is formed in the installation part by one opening being obscured by the first vibrating part, and another opening being obscured by a mourning substrate disposed on an opposite side of the installation side of the first vibrating part. Such a configuration makes it possible to increase the capacity of the back chamber of the first vibrating part, and to improve the microphone sensitivity of the first vibrating part.

The microphone unit of the configuration described above may be designed such that the case comprises an installation part for installing the first vibrating part and the second vibrating part, and a lid for forming, together with the installation part, a first accommodating space for accommodating the first vibrating part and a second accommodating space for accommodating the second vibrating part, the lid being placed over the installation part; a first open part, a second open part, a third open part, and a hollow space for communicating the first open pan, the second open part, and the third open part are formed in the installation part; the first sound hole, the second sound hole, a first concave space forming the first accommodating space, and a second concave space communicated with the second sound hole and forming the second accommodating space are formed in the lid; the first vibrating part is disposed in the installation part so as to obscure the first open part; the second vibrating part is disposed in the installation part so as to obscure the second open part; the first sound channel is formed using the first sound hole, the third open part, the hollow space, the first open part, and the second open part; the second sound channel is formed using the second sound hole and the second accommodating space; and the sealed space is formed using the first accommodating space. Even with this configuration, the case of the microphone unit is obtained with few members, and the microphone unit is easily made smaller and thinner. According to the present configuration, since the configuration can have two sound holes provided to the same surface, the microphone unit can be applied to a voice input device without complicating the structure of the voice input device.

The microphone unit of the configuration described above may be designed such that the installation part includes a base and a microphone substrate on which the first vibrating part and the second vibrating part are mounted, the microphone substrate being stacked on the base. Forming the second sound channel is easy due to the installation part being a plurality of members, as in the present configuration.

The microphone unit of the configuration described above may comprise a first electrical circuit part for processing an electrical signal obtained from the first vibrating part, and a second electrical circuit part for processing an electrical signal obtained from the second vibrating part, and may also comprise one electrical circuit part for processing electrical signals obtained from the first vibrating part and the second vibrating part.

In the microphone unit of the configuration described above, when there is one electrical circuit part, the electrical circuit part is preferably disposed so as to be between the first vibrating part and the second vibrating part. According to the present configuration, both of the two vibrating parts can be disposed in proximity to the electrical circuit part. Therefore, according to the microphone unit of the present configuration, the effects of electromagnetic noise are minimized and a satisfactory signal-to-noise ratio (SNR) is easily ensured.

The microphone unit of the configuration described above may be designed such that a switching electrode for inputting a switch signal from the exterior is provided, and the electrical circuit part includes a switch circuit for performing a switching action on the basis of the switch signal. According to the present configuration, either a signal corresponding to the first vibrating part or a signal corresponding to the second vibrating part can be selectively outputted, and both can be outputted with their outputting positions switched.

The microphone unit of the configuration described above may be designed such that the switch circuit performs the switching action based on the switch signal so as to output to the exterior either the signal corresponding to the first vibrating part or the signal corresponding to the second vibrating part. According to the present configuration, a switch circuit for selecting which of the two signals to use need not be provided to the voice input device to which the microphone unit is applied.

The microphone unit of the configuration described above may be designed such that the electrical circuit part separately outputs a signal corresponding to the first vibrating part and a signal corresponding to the second vibrating part. When a configuration is used in which the two signals are outputted separately as in the present configuration, a computation process using both signals can be performed to control the directional characteristics in the voice input device to which the microphone unit is applied.

To achieve the objects described above, the present invention is characterized in being a voice input device comprising the microphone unit of the configuration described above.

According to the present configuration, since the microphone unit comprises both a function as an omnidirectional microphone that can also pick up distant sounds and a function as a bidirectional differential microphone that takes in proximal sounds and has excellent distant noise suppression performance, it is possible to provide a high-quality voice input device that can use the microphone functions selectively with each mode.

Advantageous Effects of the Invention

According to the present invention, there can be provided a small microphone unit that is readily adapted to making a voice input device multifunctional. According to the present invention, a high-quality voice input device comprising such a microphone unit can be provided.

BRIEF DESCRIPTION OF DRAWINGS

FIG. 9B A schematic plan view of the microphone substrate constituting the microphone unit of the sixth embodiment as seen from above.

DESCRIPTION OF EMBODIMENTS

Embodiments of the microphone unit and a voice input device to which the present invention is applied are described hereinbelow in detail with reference to the drawings.

(Microphone Unit)

First, an embodiment of the microphone unit to which the present invention is applied will be described.

1. Microphone Unit of First Embodiment

Figure 1:
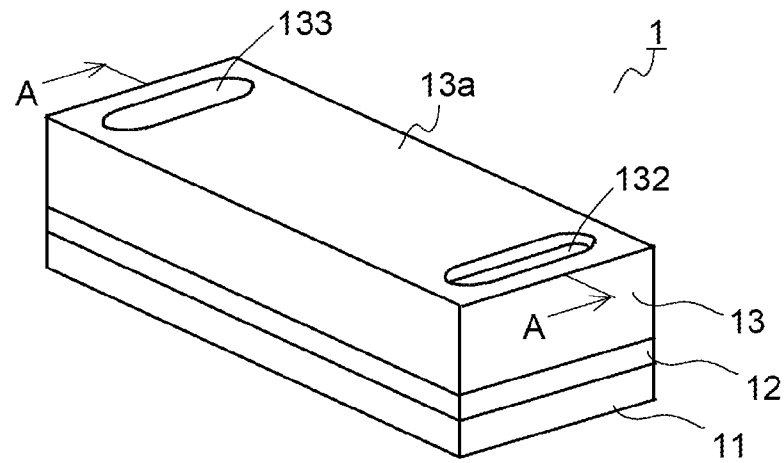
FIG. 1 A schematic perspective view showing the outer configuration of the microphone unit of the first embodiment.
Figure 2:
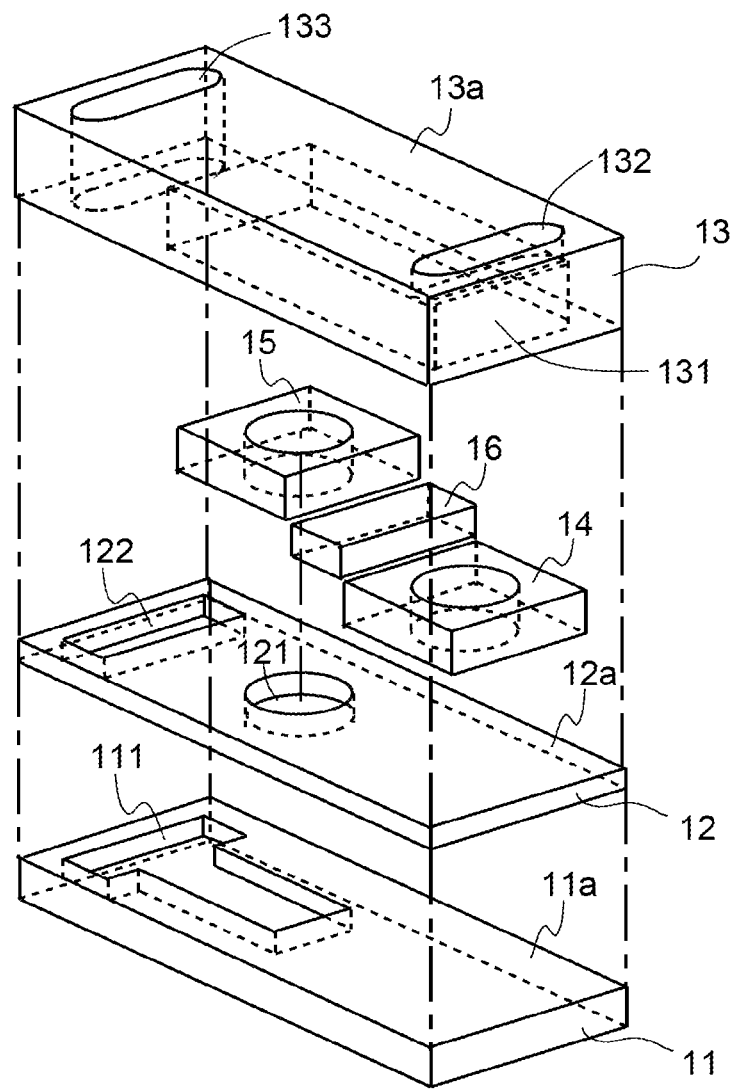
FIG. 2 An exploded perspective view showing the configuration of the microphone unit of the first embodiment.
Figure 3A:
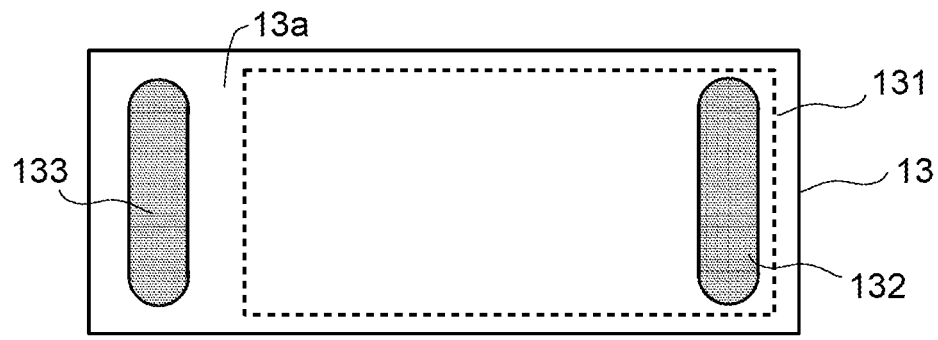
FIG. 3A A schematic plan view of a lid constituting the microphone unit of the first embodiment as seen from above.
Figure 3B:
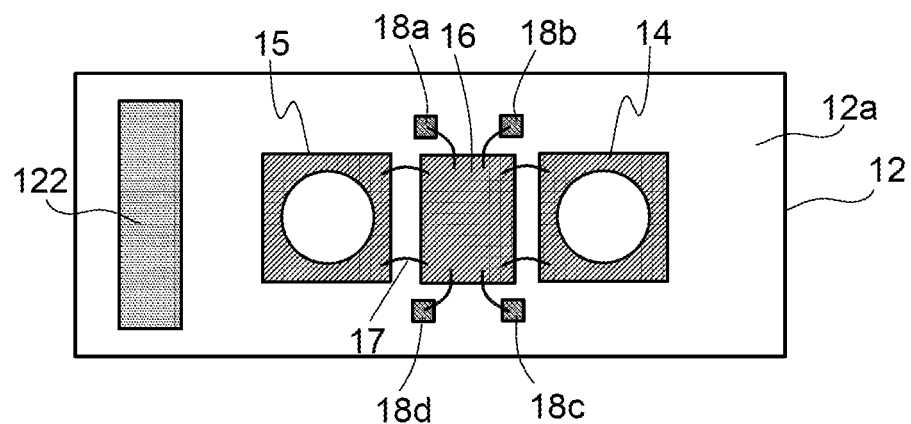
FIG. 3B A schematic plan view of a microphone substrate constituting the microphone unit of the first embodiment as seen from above.
Figure 3C:
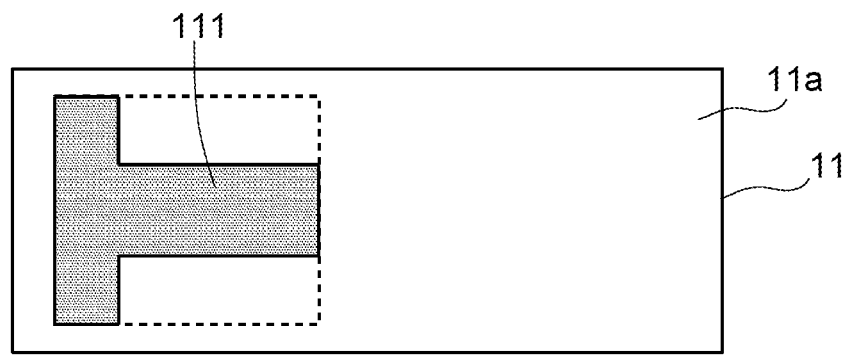
FIG. 3C A schematic plan view of the base constituting the microphone unit of the first embodiment as seen from above.
Figure 4:
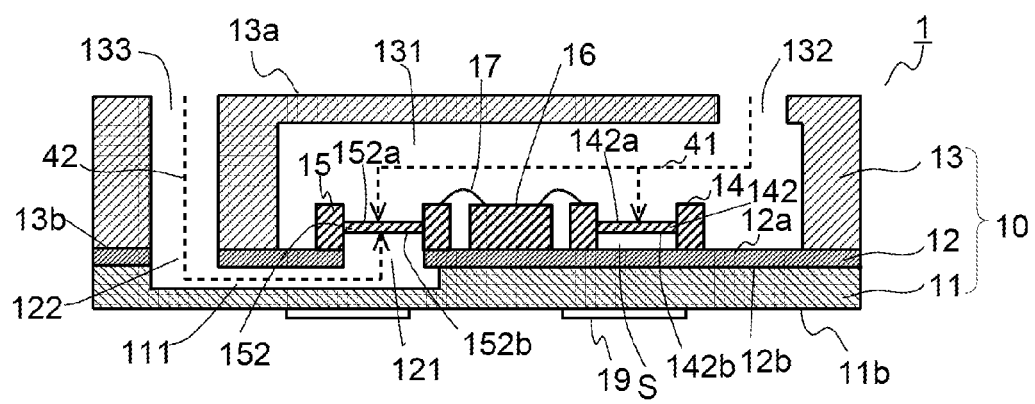
FIG. 4 A schematic cross-sectional view in the position A-A of FIG. 1.
Figure 5:
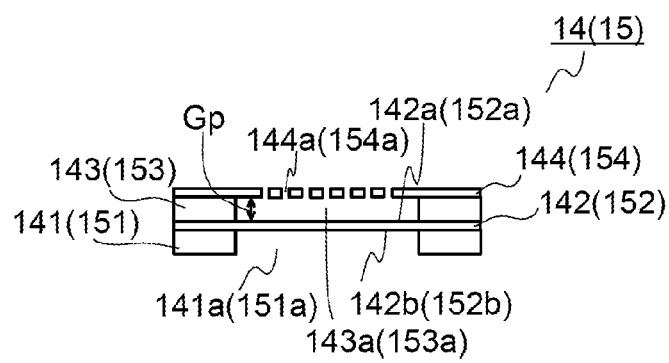
FIG. 5 A schematic cross-sectional view showing the configuration of the MEMS chip provided to the microphone unit of the first embodiment.
Figure 6:
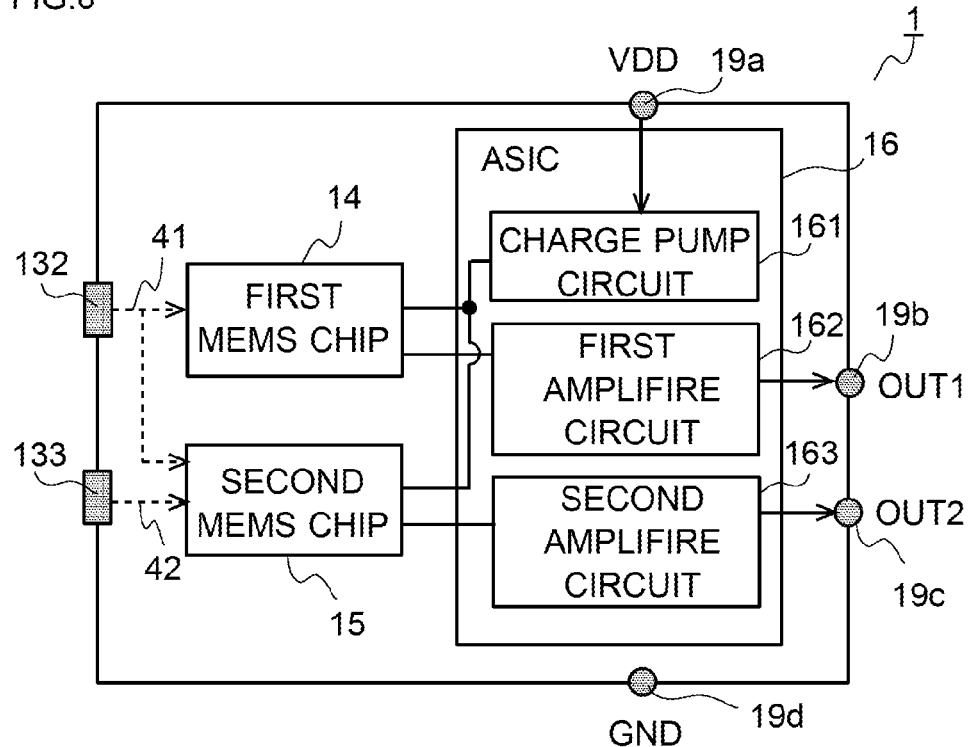
FIG. 6 A block diagram showing the configuration of the microphone unit of the first embodiment.

FIG. 1 is a schematic perspective view showing the outer configuration of the microphone unit of the first embodiment. FIG. 2 is an exploded perspective view showing the configuration of the microphone unit of the first embodiment. FIGS. 3A, 3B, and 3C are schematic plan views of members constituting the microphone unit of the first embodiment as seen from above, wherein FIG. 3A is a view of the lid as seen from above, FIG. 3B is a view of a microphone substrate equipped with a micro-electro-mechanical system (MEMS) chip and an application-specific integrated circuit (ASIC) as seen from above, and FIG. 3C is a view of the base as seen from above. FIG. 4 is a schematic cross-sectional view in the position A-A of FIG. 1. FIG. 5 is a schematic cross-sectional view showing the configuration of the MEMS chip provided to the microphone unit of the first embodiment. FIG. 6 is a block diagram showing the configuration of the microphone unit of the first embodiment. The configuration of a microphone unit 1 of the first embodiment shall be described with reference to these drawings.

The microphone unit 1 of the first embodiment as shown in FIGS. 1 through 4 has in general a configuration comprising a base 11, a microphone substrate 12 stacked on the base 11, and a lid 13 placed over the top surface (the surface opposite the surface facing the base 11) side of the microphone substrate 12.

The base 11 is composed of a plate-shaped member having a substantially rectangular shape in plan view as shown in FIGS. 2 and 3C, for example, and a first groove part 111 having a substantial T shape in plan view is formed near one end (near the left in FIG. 3C) in the longitudinal direction of the top surface 11a thereof. The base 11 may be formed using FR-4 or another substrate material, for example, and may be obtained by resin molding using LCP, PPS, or another resin, for example. In cases in which the base 11 is formed from FR-4 or another substrate material, the first groove part 111 is preferably formed using a router, for example.

The microphone substrate 12 is formed into a substantially rectangular shape in plan view as shown in FIGS. 2 and 3B, for example, and the size of the plate-shaped surface thereof (the top surface 12a) is substantially the same as the size of the plate-shaped surface (the top surface 11a) of the base 11. A first open part 121 is formed in the microphone substrate 12 near the middle of the top surface 12a as shown in FIG. 2, and a second open part 122 is formed near one end (the same side where the first groove part 111 of the base 11 is formed) in the longitudinal direction of the top surface 12a.

The first open part 121 is composed of a through-hole having a substantially circular shape in plan view, and when the microphone substrate 12 is stacked on the base 11, the position of the substrate is set so as to overlap part of the first groove part 111 formed in the base 11 (to be more accurate, a part of the portion that extends parallel to the longitudinal direction of the base 11). The second open part 122 is a through-hole having a substantially rectangular shape in plan view, whose longitudinal direction is the transverse direction of the microphone substrate 12 (the up-down direction in FIG. 3B). The position and size of the second open part 122 are set so as to overlap with the transverse direction-extending portion of the first groove part 111 formed in the base 11.

The material constituting the microphone substrate 12 is not particularly limited, but a conventionally known material is preferably used as the substrate material, e.g., FR-4, a ceramic, a polyimide film, or the like is used.

Installed on the top surface 12a of the microphone substrate 12 are a first MEMS chip 14, a second MEMS chip 15, and an ASIC 16, as shown in FIGS. 3B and 4. The configurations of the MEMS chips 14, 15 and the ASIC 16 installed on the microphone substrate 12 are described herein.

The first MEMS chip 14 and the second MEMS chip 15 are both composed of silicon chips and both have the same configuration. Therefore, the configuration of the MEMS chips is described using the first MEMS chip 14 as an example. In FIG. 5, the symbols in parentheses are symbols corresponding to the second MEMS chip 15.

The first MEMS chip 14 has an insulating first base substrate 141, a first diaphragm 142, a first insulating layer 143, and a first fixed electrode 144, as shown in FIG. 5. An opening 141a having a substantially circular shape in plan view is formed in the first base substrate 141. The first diaphragm 142 provided on top of the first base substrate 141 is a thin film which vibrates in response to acoustic pressure (vibrates in the up-down direction in FIG. 5), and is electrically conductive.

The first insulating layer 143 is provided so as to be disposed creating a gap Gp between the first diaphragm 142 and the first fixed electrode 144, and a through-hole 143a having a substantially circular shape in plan view is formed in the middle thereof. The first fixed electrode 144 disposed on top of the first insulating layer 143 is disposed facing the first diaphragm 142 while being substantially parallel, and capacitor capacitance is formed between the first diaphragm 142 and the first fixed electrode 144. A plurality of through-holes 144a are formed in the first fixed electrode 144 so that acoustic waves can pass through, and acoustic waves coming from the top side of the first diaphragm 142 reach the top surface 142a of the first diaphragm 142.

Thus, in the first MEMS chip 14 configured as a capacitor-type microphone, when the first diaphragm 142 is made to vibrate by acoustic waves, the electrostatic capacitance between the first diaphragm 142 and the first fixed electrode 144 changes. As a result, the acoustic waves (acoustic signals) incident on the first MEMS chip 14 are extracted as electrical signals. Similarly, the second MEMS chip 15 comprises a second base substrate 151, a second diaphragm 152, a second insulating layer 153, and a second fixed electrode 154, and acoustic waves (acoustic signals) incident on the second MEMS chip 15 are extracted as electrical signals as well. Specifically, the first MEMS chip 14 and the second MEMS chip 15 have the function of converting acoustic signals to electrical signals.

The configuration of the MEMS chips 14, 15 is not limited to the configuration of the present embodiment. For example, in the present embodiment, the diaphragms 142, 152 are lower than the fixed electrodes 144, 154, but a configuration in which the relationship is reversed (a relationship in which the diaphragms are above and the fixed electrodes are below) may also be used.

The ASIC 16 is an integrated circuit for amplifying electrical signals extracted based on the changes in electrostatic capacitance of the first MEMS chip 14 (originating in the vibration of the first diaphragm 142), and electrical signals extracted based on the changes in electrostatic capacitance of the second MEMS chip 15 (originating in the vibration of the second diaphragm 152).

The ASIC 16 comprises a charge pump circuit 161 for applying bypass voltage to the first MEMS chip 14 and the second MEMS chip 15, as shown in FIG. 6. The charge pump circuit 161 increases a power source voltage (from about 1.5 to 3 V, to about 6 to 10 V, for example) and applies the bypass voltage to the first MEMS chip 14 and the second MEMS chip 15. The ASIC 16 also comprises a first amplifier circuit 162 for detecting changes in electrostatic capacitance in the first MEMS chip 14, and a second amplifier circuit 163 for detecting changes in electrostatic capacitance in the second MEMS chip 15. The electrical signals amplified by the first amplifier circuit 162 and the second amplifier circuit 163 are outputted independently from the ASIC 16.

The present embodiment has a configuration in which a shared bypass voltage is applied to the first MEMS chip 14 and the second MEMS chip 15, but the present invention is not limited to this configuration. For example, two charge pump circuits 161 may be provided and may apply bypass voltages separately to the first MEMS chip 14 and the second MEMS chip 15. With such a configuration, the possibility of crosstalk occurring between the first MEMS chip 14 and the second MEMS chip 15 can be reduced.

In the microphone unit 1, the two MEMS chips 14, 15 are installed on the microphone substrate 12 with the diaphragms 142, 152 in an orientation of being nearly parallel to the top surface 12a of the microphone substrate 12, as shown in FIG. 4. In the microphone unit 1, the MEMS chips 14, 15 and the ASIC 16 are installed so as to be aligned in a row in the longitudinal direction of the top surface 12a of the microphone substrate 12 (the left-right direction in FIGS. 3B and 4). The alignment order is, starting from the left referring to FIGS. 3B and 4, the second MEMS chip 15, the ASIC 16, and the first MEMS chip 14.

The second MEMS chip 15 is installed on the top surface 12a of the microphone substrate 12 so that the second diaphragm 152 covers the first open part 121 formed in the microphone substrate 12, as shown in FIGS. 3B and 4. The first open part 121 is obscured by the second MEMS chip 15.

The two MEMS chips 14, 15 and the ASIC 16 are mounted on the microphone substrate 12 by die bonding and wire bonding. Specifically, the entire bottom surfaces of the first MEMS chip 14 and the second MEMS chip 15 that face the top surface 12a of the microphone substrate 12 are bonded without any gaps by a die bond material (not shown) (e.g., an epoxy resin-based or silicone resin-based adhesive or the like). Bonding in this manner ensures that there will be no situations in which sounds leak out from gaps formed between the top surface 12a of the microphone substrate 12 and the bottom surface of the MEMS chips 14, 15. The two MEMS chips 14, 15 are both electrically connected to the ASIC 16 by wires 17, as shown in FIG. 3B.

The bottom surface of the ASIC 16 that faces the top surface 12a of the microphone substrate 12 is bonded to the top surface 12a of the microphone substrate 12 by a die bond material (not shown). The ASIC 16 is also electrically connected by the wires 17 to each of a plurality of electrode terminals 18a, 18b, 18c, 18d formed on the top surface 12a of the microphone substrate 12, as shown in FIG. 3B. The plurality of electrode terminals 18a to 18d formed in the microphone substrate 12 are composed of a power source terminal 18a for inputting power source voltage (VDD), a first output terminal 18b for outputting electrical signals amplified by the first amplifier circuit 162 of the ASIC 16, a second output terminal 18c for outputting electrical signals amplified by the second amplifier circuit 163 of the ASIC 16, and a GND terminal 18d for a ground connection.

Each of the plurality of electrode terminals 18a to 18d provided on the top surface 12a of the microphone substrate 12 is electrically connected to external connecting electrodes 19 (specifically, a power source electrode 19a, a first output electrode 19b, a second output electrode 19c, and a GND electrode 19d (see FIG. 6)) formed on the bottom surface 11b (see FIG. 4) of the base 11, via wiring (including through wiring) (not shown) formed on the microphone substrate 12 and the base 11. The external connecting electrodes 19 are used in order to connect to connection terminals formed on the mounting substrate on which the microphone unit 1 is mounted.

The above description relates to a configuration in which the two MEMS chips 14, 15 and the ASIC 16 are mounted by wire bonding, but the two MEMS chips 14, 15 and the ASIC 16 may also of course be flip-chip mounted.

The outer shape of the lid 13 is in the shape of a substantially rectangular parallelepiped, and a substantially rectangular parallelepiped-shaped concave space 131 is formed therein, as shown in FIGS. 1 through 4. The concave space 131 has a configuration which extends to the proximity of one end side in the longitudinal direction of the lid 13 (the right side in FIG. 4), but does not extend to the proximity of the other end side (the left side in FIG. 4). The lid 13 is placed over the microphone substrate 12 with the concave space 131 and the microphone substrate 12 oriented facing each other so that an accommodating space for accommodating the two MEMS chips 14, 15 and the ASIC 16 is formed between the concave space 131 and the microphone substrate 12.

The lengths of the lid 13 in the longitudinal direction (the left-right direction of FIG. 3A) and the transverse direction (the up-down direction of FIG. 3A) are provided to be substantially equal to the size of the top surface 11a of the microphone substrate 12. Consequently, side surface parts are substantially flush in the microphone unit 1 in which the microphone substrate 12 and the lid 13 are stacked on the base 11.

In one end side in the longitudinal direction of a lid top surface 13a (the right side in FIG. 3A) is formed a first long hole 132 having a substantially elliptical shape in plan view, whose major axis direction is the transverse direction of the lid 13. The first long hole 132 is communicated with the concave space 131 of the lid 13, as shown in FIG. 4, for example. In the other end side in the longitudinal direction of the lid top surface 13a (the left side in FIG. 3A) is formed a second long hole 133 having a substantially elliptical shape in plan view, whose major axis direction is the transverse direction of the lid 13. The second long hole 133 is a through-hole passing through from the top surface 13a of the lid 13 to a bottom surface 13b, as shown in FIG. 4, for example.

The position of the second lone hole 133 is adjusted so that when the lid 13 is covering the microphone substrate 12, the second lone hole 133 is communicated with the second open part 122 formed in the microphone substrate 12.

Since the first long hole 132 and the second lone hole 133 formed in the lid 13 are holes for leading sound into the case 10 formed by the base 11, the microphone substrate 12, and the lid 13, the first long hole 132 is hereinbelow referred to as the first sound hole 132, while the second long hole 133 is referred to as the second sound hole 133.

The material constituting the lid 13 can be a resin such as a liquid crystal polymer (LCP) or polyphenylene sulfide (PPS), for example, and can also be the same substrate material as the microphone substrate 12, such as FR-4, for example.

The base 11, microphone substrate 12 (on which the two MEMS chips 14, 15 and the ASIC 16 are mounted), and lid 13 are stacked sequentially in the stated order from the bottom and co-affixed using an adhesive or the like, for example, between the members, whereby a microphone unit 1 such as the one shown in FIG. 1 is obtained. In the microphone unit 1, acoustic waves inputted from the exterior via the first sound hole 132 pass through the accommodating space (the space formed between the concave space 131 of the lid 13 and the top surface 12a of the microphone substrate 12) and reach the top surface 142a of the first diaphragm 142 and the top surface 152a of the second diaphragm 152, as shown in FIG. 4. Acoustic waves inputted from the exterior via the second sound hole 133 pass through the second open part 122, a hollow space (the space formed using the first groove part 111 of the base 11 and a bottom surface 12b of the microphone substrate 12), and the first open part 121, and reach the bottom surface 152b of the second diaphragm 152.

In other words, the microphone unit 1 is provided with a first sound channel 41 for transmitting acoustic pressure inputted from the first sound hole 132 to one surface (the top surface 142a) of the first diaphragm 142 and also to one surface (the top surface 152a) of the second diaphragm 152, and a second sound channel 42 for transmitting acoustic pressure inputted from the second sound hole 133 to the other surface (the bottom surface 152b) of the second diaphragm 152. The other surface (the bottom surface 142b) of the first diaphragm 142 faces a sealed space (a back chamber) S in which there are no acoustic leaks.

The first MEMS chip 14 is an embodiment of the first vibrating part of the present invention. The second MEMS chip 15 is an embodiment of the second vibrating part of the present invention. The ASIC 16 is an embodiment of the electrical circuit part of the present invention. The base 11, the microphone substrate 12, and the lid 13 combined together are an embodiment of the case of the present invention. The base 11 and the microphone substrate 12 combined together are an embodiment of the installation part of the present invention. An embodiment of the hollow space of the present invention (this space communicates the first open part 121 and the second open part 122) is obtained using the first groove part 111 of the base 11 and the bottom surface 12b of the microphone substrate 12.

In the microphone unit 1 of the present embodiment, the base 11, microphone substrate 12, and lid 13 constituting the case 10 are all made of the substrate material FR-4. Thus, when the material constituting the case 10 is all the same material, situations are avoided in which unnecessary stress is added to the MEMS chips 14, 15 installed on the microphone substrate 12 by a difference in the expansion coefficients in the configurational members, in cases in which the microphone unit 1 is reflow-mounted to the mount substrate. Specifically, degradation of the characteristics of the microphone unit 1 is avoided.

In the present embodiment, the base 11 constituting the installation part of the present invention is a flat plate, but is not limited to this shape. Specifically, the shape of the base, for example, may be a box shape or the like having an accommodating concavity for accommodating the microphone substrate 12 and the lid 13. By configuring in this manner, positional alignment of the base 11, microphone substrate 12, and lid 13 can be made easier, and assembling the microphone unit 1 is easier.

In the present embodiment, the shape of the first groove part 111 formed in the base 11 is a substantial T shape in plan view, but is not limited to this configuration. Specifically, the shape may be substantially rectangular in plan view (the configuration shown by the dashed lines in FIG. 3C), for example. By using a configuration such as the present embodiment, the cross-sectional area of the space that serve as sound channels can be ensured to a certain extent, and the surface area in which the microphone substrate 12 is supported by the base 11 can be increased. It is thereby easy to avoid situations in which bending of the microphone substrate 12 causes a decrease in the cross-sectional area of the hollow space that is formed using the bottom surface 12b of the microphone substrate 12 and the first groove part 111 of the base 11.

In the present embodiment, the first sound hole 132 and second sound hole 133 formed in the lid 13 are in the shapes of long holes, but are not limited to this configuration, and may be holes or the like having substantially circular shapes in plan view, for example. Long hole shapes as in the present configuration are preferred because increases in the length in the longitudinal direction of the microphone unit 1 (equivalent to the left-right direction of FIG. 4) can be suppressed, and the cross-sectional area of the sound holes can be increased.

For the same reasons, the second open part 122 provided to the microphone substrate 12 is also in the shape of a long hole, but this shape can also be suitably modified. In the present embodiment, the second open part 122, which is a passage for acoustic waves inputted from the second sound hole 133, is formed by one large through-hole. However, the configuration is not limited to such, and a plurality of small (smaller than the size of the second open part 122 of the present embodiment) through-holes aligned along the transverse direction of the microphone substrate 12 (the up-down direction of FIG. 3B) may be used as passages for acoustic waves inputted from the second sound hole 133, instead of the second open part 122, for example. Such a configuration makes it easy to form a through-hole provided to the microphone substrate 12 in order to ensure a passage for acoustic waves inputted from the second sound hole 133. The reason for having a plurality of through-holes is to increase the cross-sectional area of the passage.

In the present embodiment, the ASIC 16 is configured as being disposed so as to be present between the two MEMS chips 14, 15, but such a configuration is not necessarily provided by way of limitation. In the case that the ASIC 16 is configured so as to be between the two MEMS chips 14, 15, as in the present embodiment, the MEMS chips 14, 15 and the ASIC 16 are easily electrically connected by the wires 17. Since the distances between the MEMS chips 14, 15 and the ASIC 16 are shorter, signals outputted from the microphone unit 1 are less affected by electromagnetic noise and a satisfactory SNR is easily ensured.

Next, the operational effects of the microphone unit 1 of the first embodiment are described.

When a sound occurs in the exterior of the microphone unit 1, acoustic waves inputted from the first sound hole 132 reach the top surface 142a of the first diaphragm 142 by way of the first sound channel 41, and the first diaphragm 142 vibrates. A change in electrostatic capacitance thereby occurs in the first MEMS chip 14. An electrical signal extracted based on the change in electrostatic capacitance of the first MEMS chip 14 is amplified by the first amplifier circuit 162 and outputted from the first output electrode 19b (see FIGS. 4 and 6).

When a sound occurs in the exterior of the microphone unit 1, acoustic waves inputted from the first sound hole 132 reach the top surface 152a of the second diaphragm 152 by way of the first sound channel 41, and acoustic waves inputted from the second sound hole 133 reach the bottom surface 152b of the second diaphragm 152 by way of the second sound channel 42. Therefore, the second diaphragm 152 vibrates due to the acoustic pressure difference between the acoustic pressure added to the top surface 152a and the acoustic pressure added to the bottom surface 152b. A change in electrostatic capacitance thereby occurs in the second MEMS chip 15. An electrical signal extracted based on the change in electrostatic capacitance of the second MEMS chip 15 is amplified by the second amplifier circuit 163 and is outputted from the second output electrode 19c (see FIGS. 4 and 6).

Thus, in the microphone unit 1, signals obtained using the first MEMS chip 14 and signals obtained using the second MEMS chip IS are outputted to the exterior separately. The microphone unit 1 displays different qualities in cases in which only the first MEMS chip 14 is used and in cases in which only the second MEMS chip 15 is used. This is described hereinbelow.

Figure 7:
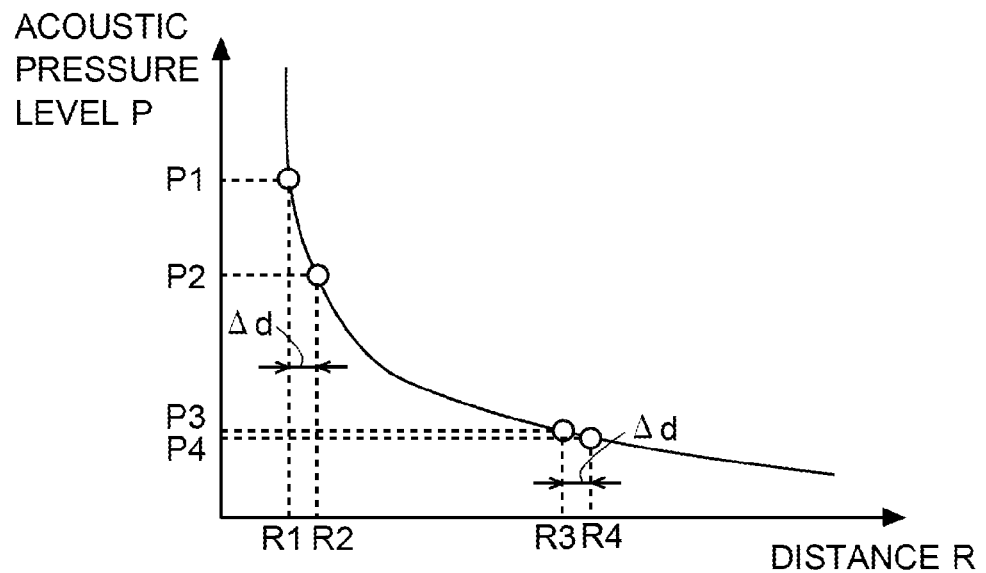
FIG. 7 A graph showing the relationship between acoustic pressure P and the distance R from the sound source.

Before this description, the qualities of the acoustic waves will be described. FIG. 7 is a graph showing the relationship between acoustic pressure P and the distance R from the sound source. Acoustic waves attenuate as they travel through air or another medium, and the acoustic pressure (the strength/amplitude of the acoustic waves) decreases, as shown in FIG. 7. The acoustic pressure is inversely proportional to the distance from the sound source, and the relationship between the acoustic pressure P and the distance R is expressed by the following formula (1). The letter k in formula (1) represents a proportionality constant.

$$P = k/R \qquad (1)$$

As is clear from FIG. 7 and formula (1), the acoustic pressure rapidly attenuates at a position near the sound source (the left side of the graph), and attenuates at a slower rate the farther from the sound source (the right side of the graph). Specifically, the acoustic pressures transmitted to two positions whose distances from the sound source differ by an amount Δd (R1 and R2, and R3 and R4) attenuates greatly (P1-P2) from R1 to R2 whose distances from the sound source are small, but does not attenuate by much (P3-P4) from R3 to R4 whose distances from the sound source are great.

Figure 8A:
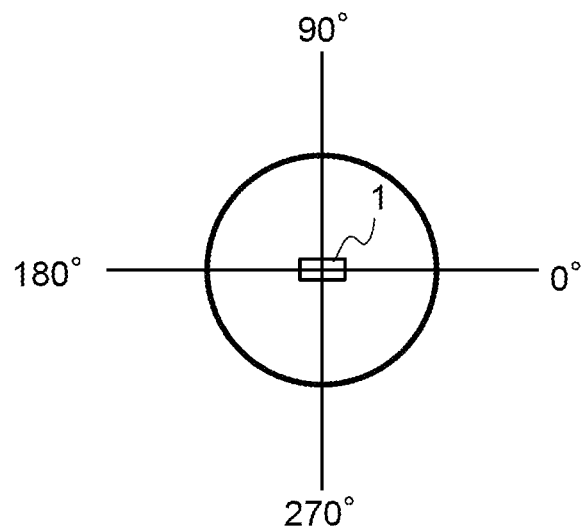
FIG. 8A A drawing for illustrating the directional characteristics of the microphone unit of the present embodiment, and for illustrating the directional characteristics in a case in which only the first MEMS chip is used.
Figure 8B:
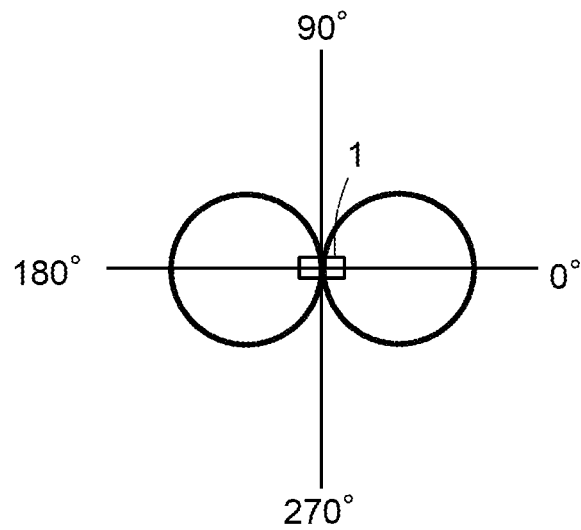
FIG. 8B A drawing for illustrating the directional characteristics of the microphone unit of the present embodiment, and for illustrating the directional characteristics in a case in which only the second MEMS chip is used.

FIGS. 8A and 8B are drawings for describing the directional characteristics of the microphone unit of the present embodiment, wherein FIG. 8A is a drawing for describing the directional characteristics in a case in which only the first MEMS chip is used, and FIG. 8B is a drawing for describing the directional characteristics in a case in which only the second MEMS chip is used. In FIGS. 8A and 8B, the orientation of the microphone unit 1 is presumed to be the same orientation as is shown in FIG. 4.

When the distance from the sound source to the first diaphragm 142 is constant, the acoustic pressure added to the first diaphragm 142 will be constant regardless of what direction the sound source is in. Specifically, in cases in which only the first MEMS chip 14 is used, the microphone unit 1 displays omnidirectional characteristics of evenly receiving acoustic waves incident from all directions, as shown in FIG. 8A.

In cases in which only the second MEMS chip 15 is used, the microphone unit 1 does not display omnidirectional characteristics, but displays bidirectional characteristics as shown in FIG. 8B. When the distance from the sound source to the second diaphragm 152 is constant, the acoustic pressure added to the second diaphragm 152 reaches a maximum when the sound source is in the 0° or 180° direction. This is because the difference between the distance for the acoustic waves to reach the top surface 152a of the second diaphragm 152 from the first sound hole 132, and the distance for the acoustic waves to reach the bottom surface 152b of the second diaphragm 152 from the second sound hole 133, will be at a maximum.

On the other hand, when the sound source is in the 90° or 270° direction, the acoustic pressure added to the second diaphragm 152 reaches a minimum (0). This is because there is substantially no difference between the distance for the acoustic waves to reach the top surface 152a of the second diaphragm 152 from the first sound hole 132, and the distance for the acoustic waves to reach the bottom surface 152b of the second diaphragm 152 from the second sound hole 133. Specifically, in cases in which only the second MEMS chip 15 is used, the microphone unit 1 displays the qualities (bidirectional properties) of readily receiving acoustic waves incident from the 0° and 180° directions but not readily receiving acoustic waves incident from the 90° and 270° directions.

Figure 9:
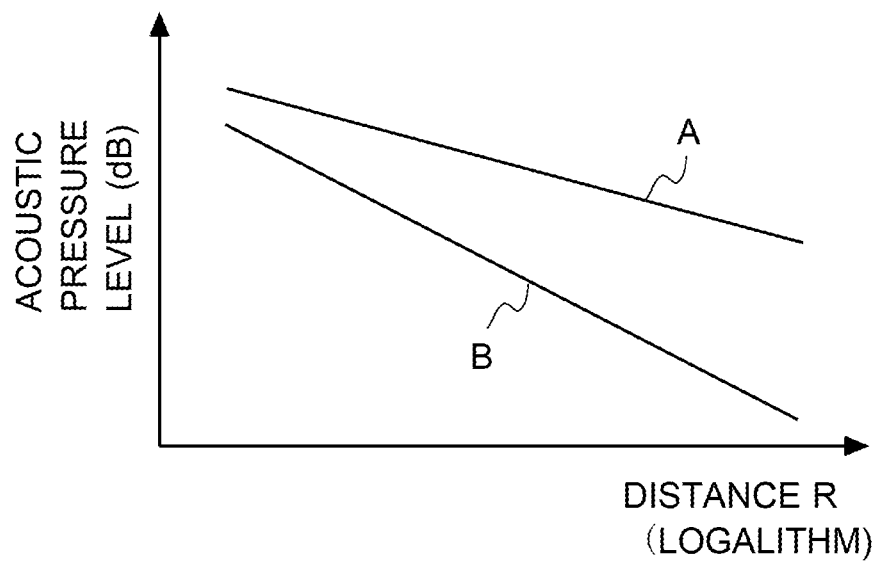
FIG. 9 Graphs for illustrating the microphone unit characteristics.

FIG. 9 is a graph for illustrating the microphone unit characteristics, wherein the horizontal axis shows the distance R from the sound source converted to a logarithm, and the vertical axis shows the acoustic pressure levels added to the diaphragms of the microphone unit. In FIG. 9, A shows the characteristics of the microphone unit in a case in which only the first MEMS chip 14 is used, and B shows the characteristics of the microphone unit in a case in which only the second MEMS chip 15 is used.

In the first MEMS chip 14, the first diaphragm 142 vibrates due to acoustic pressure added to the one surface 142a, but in the second MEMS chip 15, the second diaphragm 152 vibrates due to the difference in acoustic pressures added to both surfaces 152a, 152b. Therefore, the decrease in vibration amplitude relative to the distance from the sound source is more rapid and distance attenuation is greater in the case in which only the second MEMS chip 15 is used than in the case in which only the first MEMS chip 14 is used, as shown in FIG. 9.

In other words, in the case in which only the first MEMS chip 14 is used, the microphone unit 1 has a superior function of picking up faraway sounds from a sound source far distanced from the microphone unit 1, in comparison with the case in which only the second MEMS chip 15 is used. On the other hand, in the case in which only the second MEMS chip 15 is used, with a target sound occurring in proximity to the microphone unit 1, the microphone unit 1 has a superior function of removing background noise (referring to sounds that are not the target sound) and picking up the target sound.

The latter case is described further. The acoustic pressure of the target sound occurring in proximity to the microphone unit 1 greatly attenuates between the top surface 152a and bottom surface 152b of the second diaphragm 152, and there is a large difference between acoustic pressure transmitted to the top surface 152a of the second diaphragm 152 and acoustic pressure transmitted to the bottom surface 152b of the second diaphragm 152. Since the background noise is in a position farther from the sound source than the target sound, there is virtually no attenuation between the top surface 152a and bottom surface 152b of the second diaphragm 152, and there is an extremely small acoustic pressure difference between the acoustic pressure transmitted to the top surface 152a of the second diaphragm 152 and the acoustic pressure transmitted to the bottom surface 152b of the second diaphragm 152. The premise here is that there is a difference between the distance from the sound source to the first sound hole 132 and the distance from the sound source to the second sound hole 133.

Since the acoustic pressure difference of the background noise received by the second diaphragm 152 is small, acoustic pressure of background noise is substantially negated in the second diaphragm 152. Since the acoustic pressure difference of the target sound received by the second diaphragm 152 is large, the acoustic pressure of the target sound is not negated in the second diaphragm 152. Therefore, a signal obtained by the vibration of the second diaphragm 152 is regarded as a signal of the target sound from which background noise has been removed. Therefore, in cases in which only the second MEMS chip 15 is used, the microphone unit 1 has a superior function of removing background noise and picking up a target sound occurring in its proximity.

As described above, in the microphone unit 1, signals extracted from the first MEMS chip 14 and signals extracted from the second MEMS chip 15 are separately processed (amplified) and separately outputted to the exterior. Therefore, in a voice input device to which the microphone unit 1 is applied, when it is possible to suitably select which of the signals outputted from the MEMS chips 14, 15 will be used, the microphone unit can be adapted to making the voice input device multifunctional.

As a specific example, a case in which the microphone unit 1 is applied to a mobile telephone is described. During communication with a mobile telephone, usually the user speaks with their mouth in proximity to the microphone unit 1. Therefore, the microphone unit preferably can remove background noise and pick up only target sounds, as a function during mobile telephone communication. Therefore, during communication, for example, it is preferable that from among the signals outputted from the microphone unit 1, only the signals extracted from the second MEMS chip 15 be used.

As described above, recent mobile telephones are provided with hands free functions and video recording functions. When a mobile telephone is used in such a mode, it is necessary that sounds far distanced from the microphone unit 1 can be picked up. In order to achieve this, when the hands free function or video recording function of the mobile telephone is used, for example, it is preferable that from among the signals outputted from the microphone unit 1, only the signals extracted from the first MEMS chip 14 be used.

As described above, the microphone unit 1 of the present embodiment has a configuration provided with both a function as a bidirectional differential microphone having an excellent distant noise suppression performance, and a function as an omnidirectional microphone capable of picking up faraway sounds from a sound source in a position distanced from the microphone unit 1. Therefore, the microphone unit of the present embodiment is readily adapted to imparting multifunctional capability to the voice input device to which the microphone unit is applied. Since the microphone unit 1 of the present embodiment has both of these functions, there is no need to separately install two microphone units as in conventional practice, and size increases in the voice input device are readily suppressed.

The microphone unit 1 has a configuration in which the first sound channel 41 and the second sound channel 42 are formed by three members: the base 11, the microphone substrate 12, and the lid 13; and this configuration is readily assembled, reduced in size, and made thinner. Since the two sound holes 132, 133 are provided to the same surface 13a (the top surface) in this configuration, the configuration of the voice input device (the configuration of the sound channels) to which the microphone unit is applied is easily made into a simple configuration.

The microphone unit 1 of the present embodiment is configured having two MEMS chips 14, 15. However, because the configuration has only one MEMS chip additionally disposed in the space originally provided to a bidirectional differential microphone having excellent distant noise suppression performance (the microphone unit previously developed by the inventors), there is no size increase in the microphone unit with the addition of the MEMS chip. This is described below.

In the microphone unit 1 of the present embodiment, when the first MEMS chip 14 is taken out, a bidirectional differential microphone unit having excellent distant noise suppression performance is obtained. In this microphone unit, the distance between the centers of the two sound holes 132, 133 is preferably about 5 mm. This is due to the following reasons.

When the distance between the first sound hole 132 and the second sound hole 133 is too small, the difference between acoustic pressures added to the top surface 152a and bottom surface 152b of the second diaphragm 152 is small, the amplitude of the second diaphragm 152 is small, and the electrical signals outputted from the ASIC 16 have a poor SNR. Therefore, it is preferable that the distance between the first sound hole 132 and the second sound hole 133 be increased to a certain extent. On the other hand, when the distance between the first sound hole 132 and the second sound hole 133 is too great, there is a large time difference, i.e., phase difference for acoustic waves produced from the sound source to pass through the first sound hole 132 and the second sound hole 133 and reach the second diaphragm 152, and noise removal performance decreases. Therefore, the distance between the centers of the first sound hole 132 and the second sound hole 133 is preferably 4 mm or greater and 6 mm or less, and more preferably about 5 mm.

The lengths of the MEMS chips 14, 15 (lengths in a direction parallel to a line joining the centers of the two sound holes 132, 133, lengths in the left-right direction in FIG. 4) used in the microphone unit 1 of the present embodiment are about 1 mm, for example, and the length of the ASIC 16 in the same direction is about 0.7 mm, for example. When the microphone unit is made to function as a differential microphone, it is preferably configured so that the time for acoustic waves to reach the top surface 152a of the second diaphragm 152 from the first sound hole 132 and the time for acoustic waves to reach the bottom surface 152b of the second diaphragm 152 from the second sound hole 133 are substantially the same. Therefore, the second MEMS chip 15 is disposed in the accommodating space (the space formed between the concave space 131 of the lid 13 and the top surface 12a of the microphone substrate 12) in a position separated from the first sound hole 132 (a position near the left of the accommodating space in FIG. 4).

Therefore, a space in which the first MEMS chip 14 can be disposed is originally present in the accommodating space of the bidirectional differential microphone unit having excellent distant noise suppression performance. Consequently, it is possible to reduce the size of the microphone unit 1 of the present embodiment, wherein the function as an omnidirectional microphone capable of picking up faraway sounds from a sound source in a position separated from the microphone unit 1 is added to the function as a bidirectional differential microphone having excellent distant noise suppression performance.

In the present embodiment, the amplifier gain of the first amplifier circuit 162 for detecting changes in electrostatic capacitance in the first MEMS chip 14 and the amplifier gain of the second amplifier circuit 163 for detecting changes in electrostatic capacitance in the second MEMS chip 15 may be set to different gains. Since the second diaphragm 152 of the second MEMS chip 15 vibrates due to the difference in acoustic pressures added to the two surfaces 152a, 152b, the vibration amplitude thereof is less than the vibration amplitude of the first diaphragm 142 of the first MEMS chip 14. Therefore, the amplifier gain of the second amplifier circuit 163 may be increased above the amplifier gain of the first amplifier circuit 162, for example. The output signal amplitude from the first amplifier circuit 162 and the output signal amplitude from the second amplifier circuit 163 can be made to be substantially equal. More specifically, when the distance between the centers of the two sound holes 132, 133 is about 5 mm, the amplifier gain of the second amplifier circuit 163 is preferably set to value higher than the amplifier gain of the first amplifier circuit 162 by about 6 to 14 dB.

2. Microphone Unit of Second Embodiment

Next, the microphone unit of the second embodiment will be described. A large portion of the configuration of the microphone unit of the second embodiment is identical to that of the microphone unit 1 of the first embodiment. Only the portion that is different is described hereinbelow. Portions duplicated from the microphone unit 1 of the first embodiment are described using the same symbols.

Figure 10:
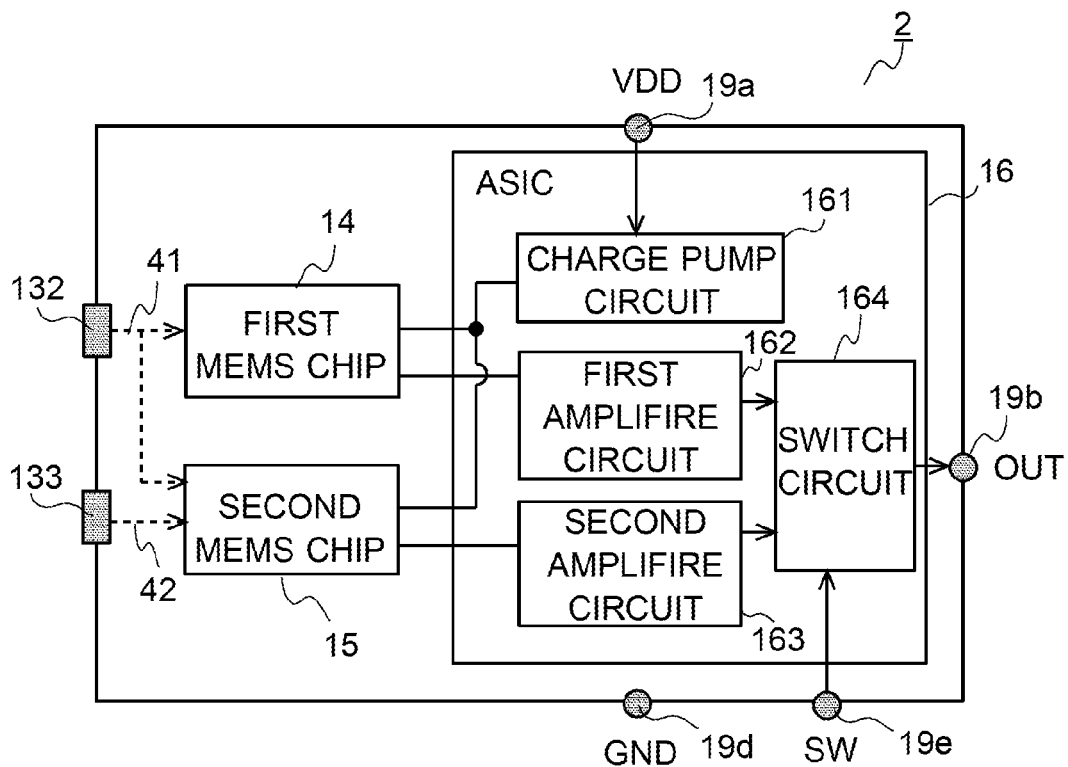
FIG. 10 A block diagram showing the configuration of the microphone unit of the second embodiment.

FIG. 10 is a block diagram showing the configuration of the microphone unit of the second embodiment. In the microphone unit 2 of the second embodiment, a switching electrode 19e is provided for inputting switch signals from the exterior (the voice input device in which the microphone unit 2 is mounted), and this microphone unit differs from the microphone unit 1 of the first embodiment in that a switch circuit 164 provided to the ASIC 16 is actuated by a switch signal sent via the switching electrode 19e, as shown in FIG. 10.

Figure 11:
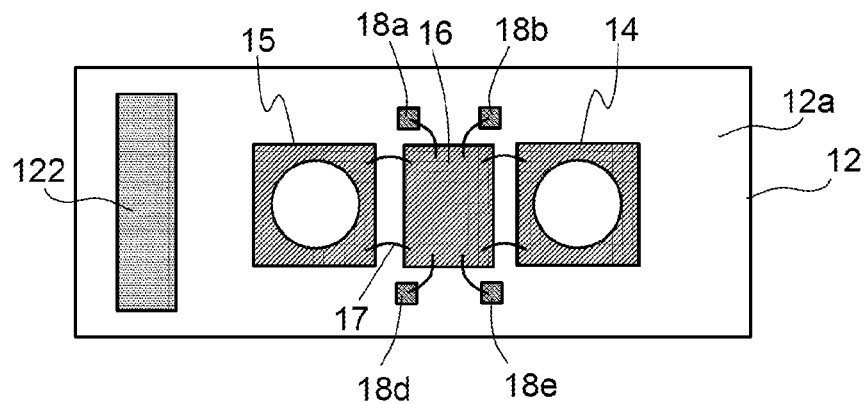
FIG. 11 A schematic plan view of the microphone substrate provided to the microphone unit of the second embodiment as seen from above.

Since the configuration is provided with the switching electrode 19e, a switching terminal 18e is provided to the top surface 12a of the microphone substrate 12, as shown in FIG. 11.

The switch circuit 164 is a circuit for switching between externally outputting the signal outputted from the first amplifier circuit 162, and externally outputting the signal outputted from the second amplifier circuit 163, as shown in FIG. 10. Specifically, in the microphone unit 2 of the second embodiment, the signal outputted from the microphone unit 2 is either only the signal extracted from the first MEMS chip 14 or only the signal extracted from the second MEMS chip 15.

Consequently, unlike the microphone unit 1 of the first embodiment, in the microphone unit 2 of the second embodiment, a single output electrode (the first output electrode 19b) is included in the external connecting electrodes 19 provided to the bottom surface 11b of the base 11. In connection with this, only the first output terminal 18b is provided to the top surface 12a of the microphone substrate 12 as shown in FIG. 11, and the second output terminal 18c is omitted (see also FIG. 3B).

The switching action of the switch circuit 164 according to the switch signal is preferably configured to use the signals H (high level) and L (low level), for example.

The operational effects of the microphone unit 2 of the second embodiment are described.

When a sound occurs outside of the microphone unit 2, acoustic waves inputted from the first sound hole 132 reach the top surface 142a of the first diaphragm 142 by way of the first sound channel 41, and the first diaphragm 142 vibrates. A change in electrostatic capacitance thereby occurs in the first MEMS chip 14. An electrical signal extracted based on the change in electrostatic capacitance of the first MEMS chip 14 is amplified by the first amplifier circuit 162. When the switch circuit 164 is electrically connecting the first amplifier circuit 162 and the first output electrode 19b on the basis of the switch signal inputted to the switching electrode 19e, the amplified signal is outputted from the first output electrode 19b (see FIG. 10).

When a sound occurs outside the microphone unit 2, acoustic waves inputted from the first sound hole 132 also reach the top surface 152a of the second diaphragm 152 by way of the first sound channel 41, and acoustic waves inputted from the second sound hole 133 reach the bottom surface 152b of the second diaphragm 152 by way of the second sound channel 42. Therefore, the second diaphragm 152 vibrates due to the acoustic pressure difference between the acoustic pressure added to the top surface 152a and the acoustic pressure added to the bottom surface 152b. A change in electrostatic capacitance thereby occurs in the second MEMS chip 15. An electrical signal extracted based on the change in electrostatic capacitance of the second MEMS chip 15 is amplified by the second amplifier circuit 163. When the switch circuit 164 is electrically connecting the second amplifier circuit 163 and the first output electrode 19b on the basis of the switch signal inputted to the switching electrode 19e, the amplified signal is outputted from the first output electrode 19b (see FIG. 10).

Similar to the case of the first embodiment, the microphone unit 2 of the second embodiment is also configured comprising both a function as a bidirectional differential microphone having excellent distant noise suppression performance, and a function as an omnidirectional microphone capable of picking up faraway sounds from a sound source in a position separated from the microphone unit 2. Unlike the case of the first embodiment, however, in the microphone unit 2, only a signal corresponding to one of either these two functions is outputted based on the switch signal. In the case of such a configuration, as in the case of the first embodiment, a switching action of choosing which of the two inputted voice signals will be used need not be performed in the voice input device in which the microphone unit 2 is installed.

The present embodiment has a configuration in which the two amplifier circuits 162, 163 are provided, the switch circuit 164 is provided after the amplifier circuits 162, 163, and signals corresponding to the first MEMS chip 14 and signals corresponding to the second MEMS chip 15 are switched and outputted. Since it is preferably possible to switch and output signals corresponding to the first MEMS chip 14 and signals corresponding to the second MEMS chip 15, the configuration may have one amplifier circuit, and a switch circuit for performing a switching action according to a switch signal may be disposed between the amplifier circuit and the two MEMS chips 14, 15, for example.

In cases in which two amplifier circuits 162, 163 are provided as in the present embodiment, the amplifier gains of the two amplifier circuits 162, 163 may be set to different gains. The amplifier gain of the second amplifier circuit 163 herein is preferably greater than the amplifier gain of the first amplifier circuit 162.

The present embodiment has a configuration in which a shared bypass voltage is applied to the first MEMS chip 14 and the second MEMS chip, but the embodiment is not limited to such and may have another configuration. Specifically, the switch signal and the switch circuit may be used to switch which of the first MEMS chip 14 and the second MEMS chip 15 is electrically connected with the charge pump circuit 161, for example. This allows the possibility of crosstalk occurring between the first MEMS chip 14 and the second MEMS chip 15 to be reduced.

3. Microphone Unit of Third Embodiment

Next, the microphone unit of the third embodiment will be described. A large portion of the configuration of the microphone unit of the third embodiment is identical to that of the microphone unit 1 of the first embodiment. Only the portion that is different is described hereinbelow. Portions duplicated from the microphone unit 1 of the first embodiment are described using the same symbols.

Figure 12:
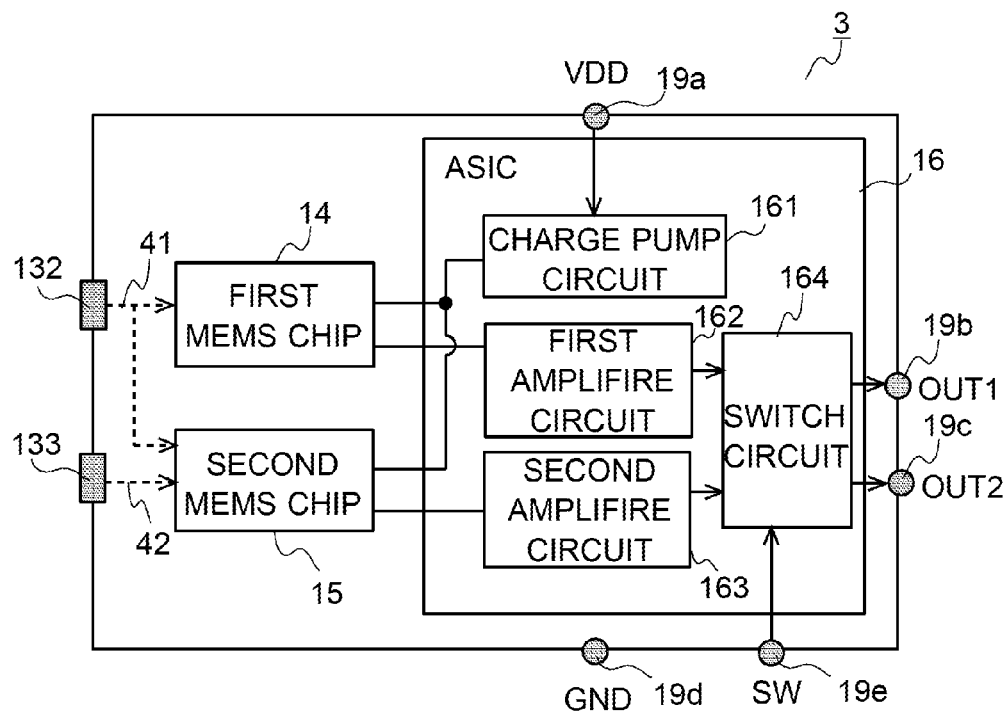
FIG. 12 A block diagram showing the configuration of the microphone unit of the third embodiment.

FIG. 12 is a block diagram showing the configuration of the microphone unit of the third embodiment. In the microphone unit 3 of the third embodiment, a switching electrode 19e is provided for inputting switch signals from the exterior (the voice input device in which the microphone unit 3 is mounted), and this microphone unit differs from the microphone unit 1 of the first embodiment in that a switch circuit 164 provided to the ASIC 16 is actuated by a switch signal sent via the switching electrode 19e, as shown in FIG. 12.

Figure 13:
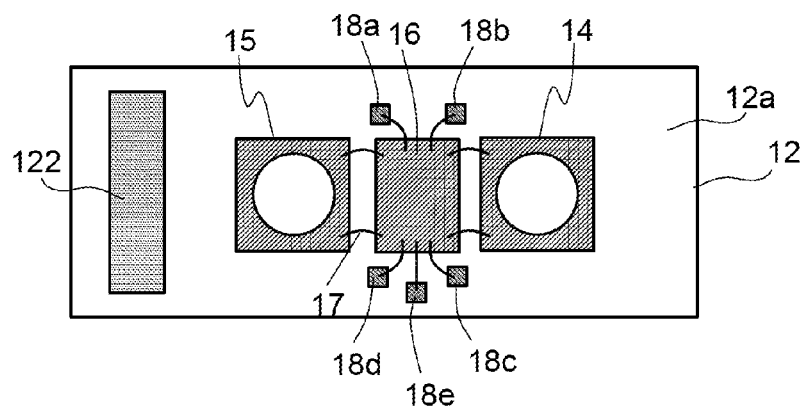
FIG. 13 A schematic plan view of the microphone substrate provided to the microphone unit of the third embodiment as seen from above.

Since the configuration is provided with the switching electrode 19e, a switching terminal 18e is provided to the top surface 12a of the microphone substrate 12, as shown in FIG. 13.

The switch circuit 164 has a configuration for switching between which of the two output electrodes 19b, 19c (some of the external connecting electrodes 19) will output the signal outputted from the first amplifier circuit 162 and the signal outputted from the second amplifier circuit 163 (this function is different from the switch circuit of the second embodiment).

Specifically, when the switch circuit 164 is in a first mode according to the switch signal inputted from the switching electrode 19e, a signal corresponding to the first MEMS chip 14 is outputted from the first output electrode 19b, and a signal corresponding to the second MEMS chip 15 is outputted from the second output electrode 19c. When the switch circuit 164 is in a second mode according to the switch signal, a signal corresponding to the second MEMS chip 15 is outputted from the first output electrode 19b, and a signal corresponding to the first MEMS chip 14 is outputted from the second output electrode 19c.

The switching action of the switch circuit 164 according to the switch signal is preferably configured to use the signals H (high level) and L (low level), for example.

In cases in which the microphone unit and the voice input device are manufactured by different manufacturers, the following types of manufacturers are presumed to be among the manufacturers who manufacture the voice input device.

(A) Those who would prefer that both the signal corresponding to the first MEMS chip 14 and the signal corresponding to the second MEMS chip 15 be outputted from the microphone unit, as in the microphone unit 1 of the first embodiment.

(B) Those who would prefer that between the signal corresponding to the first MEMS chip 14 and the signal corresponding to the second MEMS chip 15, which is outputted from the microphone unit be determined by switching according to the switch signal, as in the microphone unit 2 of the second embodiment.

The microphone unit 3 of the third embodiment is advantageous in this respect because it can be adapted to both types of manufacturers in the above (A) and (B).

In the present embodiment as well, the amplifier gains of the two amplifier circuits 162, 163 may be set to different gains. The amplifier gain of the second amplifier circuit 163 herein is preferably greater than the amplifier gain of the first amplifier circuit 162.

4. Microphone Unit of Fourth Embodiment

Next, the microphone unit of the fourth embodiment will be described. A large portion of the configuration of the microphone unit of the fourth embodiment is identical to that of the microphone unit 1 of the first embodiment. Only the portion that is different is described hereinbelow. Portions duplicated from the microphone unit 1 of the first embodiment are described using the same symbols.

Figure 14:
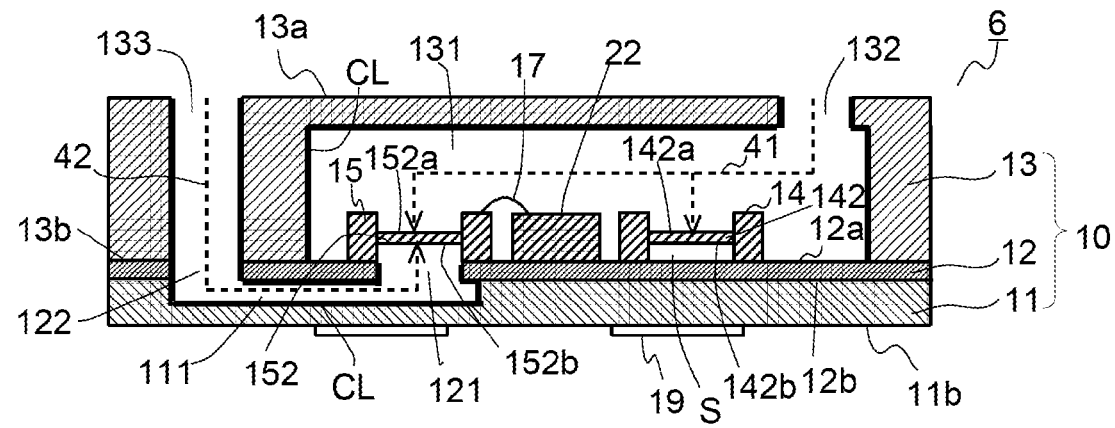
FIG. 14 A schematic cross-sectional view showing the configuration of the microphone unit of the fourth embodiment.
Figure 15:
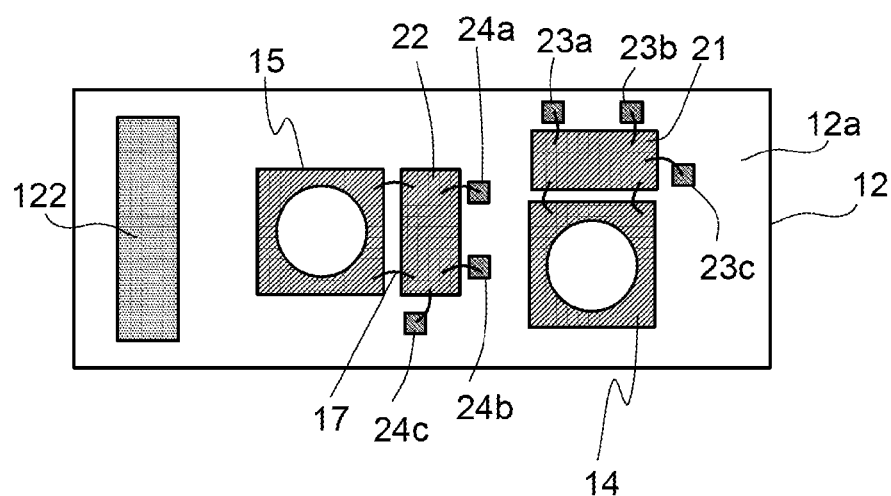
FIG. 15 A schematic plan view of the microphone substrate provided to the microphone unit of the fourth embodiment as seen from above.
Figure 16:
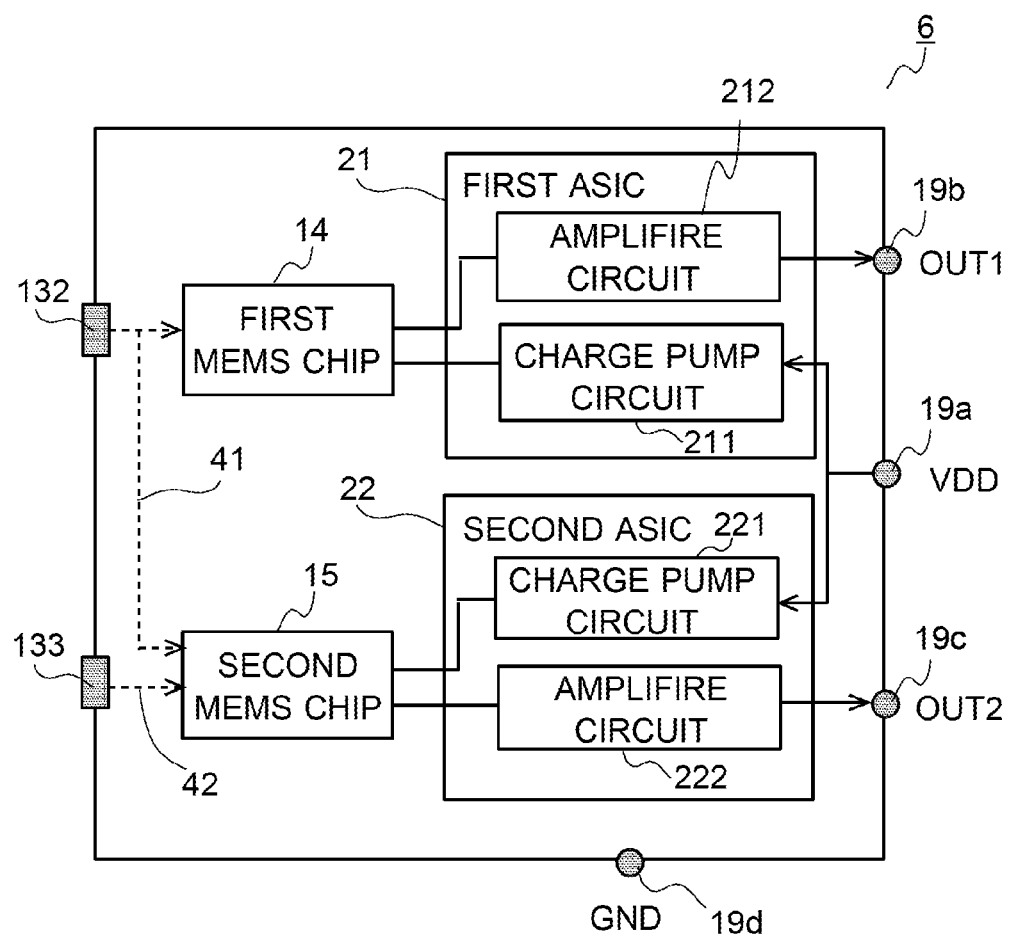
FIG. 16 A block diagram showing the configuration of the microphone unit of the fourth embodiment.

FIG. 14 is a schematic cross-sectional view showing the configuration of the microphone unit of the fourth embodiment. The cross-sectioned position of FIG. 14 is presumed to be the same position as FIG. 4. FIG. 15 is a schematic plan view of the microphone substrate provided to the microphone unit of the fourth embodiment as seen from above. FIG. 16 is a block diagram showing the configuration of the microphone unit of the fourth embodiment.

The main difference between the microphone unit 6 of the fourth embodiment and the microphone unit 1 of the first embodiment is the number of ASICs installed on the microphone substrate 12. Specifically, the first embodiment had a configuration in which electrical signals extracted by the first MEMS chip 14 and the second MEMS chip 15 are amplified by one ASIC 16. However, in the microphone unit 6 of the fourth embodiment, electrical signals extracted based on changes in the electrostatic capacitance of the first MEMS chip 14 are amplified by a first ASIC 21, and electrical signals extracted based on changes in the electrostatic capacitance of the second MEMS chip 15 are amplified by a second ASIC 22.

In the microphone unit 6 of the fourth embodiment, as shown in FIG. 15, the first ASIC 21 is disposed so as to be aligned with the first MEMS chip 14 in the transverse direction (the transverse direction of the microphone substrate 12), and the second ASIC 22 is disposed so as to be aligned with the second MEMS chip 15 in the longitudinal direction (the longitudinal direction of the microphone substrate 12). Where the two ASICs 21, 22 are disposed can be suitably varied. The first MEMS chip 14 is electrically connected by wires 17 to the first ASIC 21, and the second MEMS chip 15 is electrically connected by wires 17 to the second ASIC 22.

The first ASIC 21 comprises a charge pump circuit 211 for applying bypass voltage to the first MEMS chip 14, as shown in FIG. 16. The charge pump circuit 211 increases a power source voltage VDD to apply bypass voltage to the first MEMS chip 14. The first ASIC 21 also comprises an amplifier circuit 212 for detecting changes in electrostatic capacitance in the first MEMS chip 14. Electrical signals amplified by the amplifier circuit 212 are outputted from the first ASIC 21 (OUT 1). Similarly, the second ASIC 22 also comprises a charge pump circuit 221 for applying bypass voltage to the second MEMS chip 15, and an amplifier circuit 222 for detecting changes in electrostatic capacitance and outputting amplified electrical signals (OUT 2).

The first ASIC 21 is electrically connected by wires 17 with each of a plurality of electrode terminals 23a, 23b, 23c formed on the top surface 12a of the microphone substrate 12, as shown in FIG. 15. The electrode terminal 23a is a power source terminal for inputting a power source voltage (VDD), the electrode terminal 23b is a first output terminal for outputting electrical signals amplified by the amplifier circuit 212 of the first ASIC 21, and the electrode terminal 23c is a GND terminal for connecting to ground.

Similarly, the second ASIC 22 is electrically connected by wires 17 with each of a plurality of electrode terminals 24a, 24b, 24c formed on the top surface 12a of the microphone substrate 12. The electrode terminal 24a is a power source terminal for inputting a power source voltage (VDD), the electrode terminal 24b is a second output terminal for outputting electrical signals amplified by the amplifier circuit 222 of the second ASIC 22, and the electrode terminal 24c is a GND terminal for connecting to ground.

The electrode terminals 23a and 24a are electrically connected to a power source electrode pad 19a (included in the external connecting electrodes 19) provided on the bottom surface 11b of the base 11. The first output terminal 23b is electrically connected to a first output electrode pad 19b (included in the external connecting electrodes 19) provided on the bottom surface 11b of the base 11. The second output terminal 24b is electrically connected to a second output electrode pad 19c (included in the external connecting electrodes 19) provided on the bottom surface 11b of the base 11.

The GND electrodes 23c and 24c are electrically connected to a GND electrode pad 19d provided on the bottom surface 11b of the base 11.

The microphone unit 6 of the fourth embodiment also differs from the microphone unit 1 of the first embodiment in that a coating layer CL is formed over the wall surfaces of the sound channel (part of the second sound channel 42) provided in the installation part configured by the base 11 and microphone substrate 12, and the inner wall of the lid 13.

In cases in which the material of the base 11, the microphone substrate 12, and the lid 13 is a substrate material (e.g., a glass epoxy substrate) susceptible to fibrous dust being produced from the processed surfaces (surfaces that are subjected to cutting, machining, or the like), for example, problems sometimes occur wherein the dust fills into the gaps (about 1 µm, for example) between the fixed electrodes 144, 154 of the MEMS chips 14, 15 and the diaphragms 142, 152, and the MEMS chips 14, 15 cease to function properly. When a coating layer CL is applied as in the microphone unit 6 of the fourth embodiment, the production of tiny dust can be prevented and this problem can be resolved.

The coating layer CL may be obtained using a plating technique, for example, or, more specifically, the coating layer CL may be obtained by Cu plating, for example. The coating layer CL may also be obtained by curtain coating a resist material capable of exposure and development, for example. The coating layer CL may also be configured from a plurality of layers.

The microphone unit 6 of the fourth embodiment is configured with the coating layer CL provided to the installation part (composed of the base 11 and the microphone substrate 12) and the lid 13, but the microphone unit is not limited to this configuration, and may be configured with the coating layer CL provided only to the installation part, for example. The coating layer CL (a Cu plating layer as a specific example) provided to the installation part and the lid 13 may also be connected to a static electric potential (GND). Such a configuration makes it possible to electromagnetically shield the tops and bottoms of the MEMS chips 14, 15, and also makes it possible to improve resistance against external electromagnetic fields (to prevent infiltration of external noise).

In the microphone unit 6 of the fourth embodiment, other than LCP, PPS, or another resin material; FR-4 or another glass epoxy material; and ceramics; the lid 13 can also be configured from aluminum, brass, iron, copper, or another electroconductive metal material. The effect of an electromagnetic shield can be provided by connecting the metal parts with the GND part of the user substrate or the installation part. Even in cases in which the lid 13 is configured from an insulating material such as a glass epoxy material or a ceramic material, the same effect of a metal electromagnetic shield can be provided also by applying an electroconductive plating on the surface. Specifically, the effect of an electromagnetic shield can be provided by applying electroconductive plating (metal plating) on the outer wall surfaces of the top part and side parts of the lid 13 and connecting the lid with the GND part of the user substrate or the installation part.

To make the microphone unit 6 thinner, the configurational components must be reduced in thickness, but when the resin material and glass epoxy material are 0.2 mm or less in thickness they become extremely weak in terms of strength, and problems occur such as the outer walls vibrating due to external acoustic pressure, compromising the microphone's original sound pickup capability. By forming an electroconductive metal film on the outer wall surfaces of the lid 13, the mechanical strength of the lid 13 can be increased to increase resistance against external stress, and the microphone's original sound pickup capability can be exhibited with less unnecessary vibration.

The coating layer CL (specifically, the Cu plating layer) provided to the installation part and the lid 13 may be connected to a static electric potential (GND or a power source). The resistance of the MEMS chips 14, 15 against external electromagnetic fields from below can be improved by the coating layer CL provided to the installation part. The resistance of the MEMS chips 14, 15 against external electromagnetic fields coming in from above can also be improved by the coating layer CL provided to the lid 13. Thereby, it is possible to electromagnetically shield both the top and bottom sides of the MEMS chips 14, 15, and it is possible to significantly improve resistance against external electromagnetic fields (to prevent infiltration of external electromagnetic field noise).

As shall be apparent, the electromagnetic shield may also be obtained by placing a shield cover so as to cover the case 10 of the microphone unit 6. Furthermore, dust countermeasures using the coating layer described above can also be applied to the microphone units 1 to 3 of the first through third embodiments.

In the microphone unit 6 of the fourth embodiment, similar to the first embodiment, signals extracted from the first MEMS chip 14 and signals extracted from the second MEMS chip 15 are separately processed (amplified) and separately outputted to the exterior. Therefore, when either of the signals outputted from the MEMS chips 14, 15 are suitably selected and used in the voice input device to which the microphone unit 6 is applied, this approach can be adapted to making the voice input device multifunctional.

The amplifier gain of the amplifier circuit 212 for detecting electrostatic capacitance changes in the first MEMS chip 14 and the amplifier gain of the amplifier circuit 222 for detecting electrostatic capacitance changes in the second MEMS chip 15 may be set to different gains. The amplifier gain of the amplifier circuit 222 of the second ASIC 22 is preferably greater than the amplifier gain of the amplifier circuit 212 of the first ASIC 21.

5. Microphone Unit of Fifth Embodiment

Next, the microphone unit of the fifth embodiment will be described. Similar to the microphone unit 6 of the fourth embodiment, the microphone unit of the fifth embodiment has two MEMS chips 14, 15 and two ASICs 21, 22. The configuration for extracting electrical signals from the MEMS chips 14, 15 (the electrical processing configuration) is identical to that of the microphone unit 6 of the fourth embodiment. However, the microphone unit of the fifth embodiment is significantly different from the microphone unit 6 of the fourth embodiment in that the first MEMS chip 14 and the second MEMS chip 15 are accommodated in separate spaces. This difference is the focus of the description hereinbelow. Portions duplicated from the microphone unit 6 of the fourth embodiment are referenced with the same symbols, and descriptions thereof are omitted when a description is not particularly necessary.

Figure 17A:
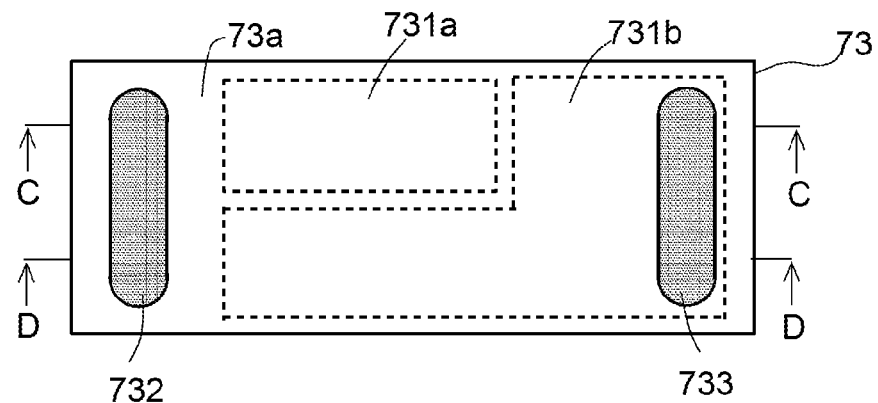
FIG. 17A A schematic plan view of the lid constituting the microphone unit of the fifth embodiment as seen from above.
Figure 17B:
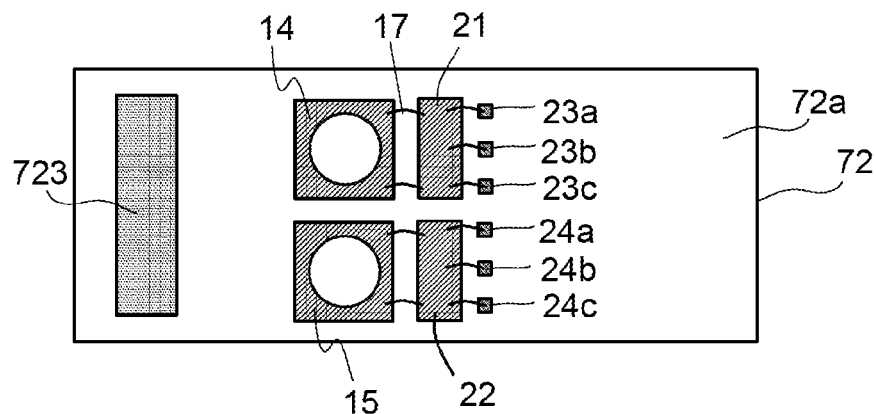
FIG. 17B A schematic plan view of the microphone substrate constituting the microphone unit of the fifth embodiment as seen from above.
Figure 17C:
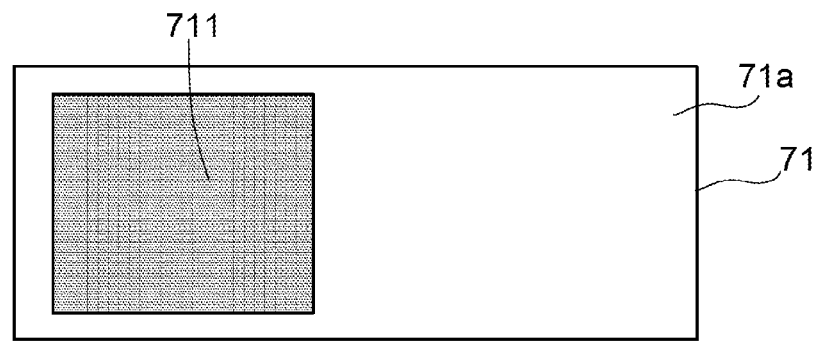
FIG. 17C A schematic plan view of the base constituting the microphone unit of the fifth embodiment as seen from above.
Figure 18A:
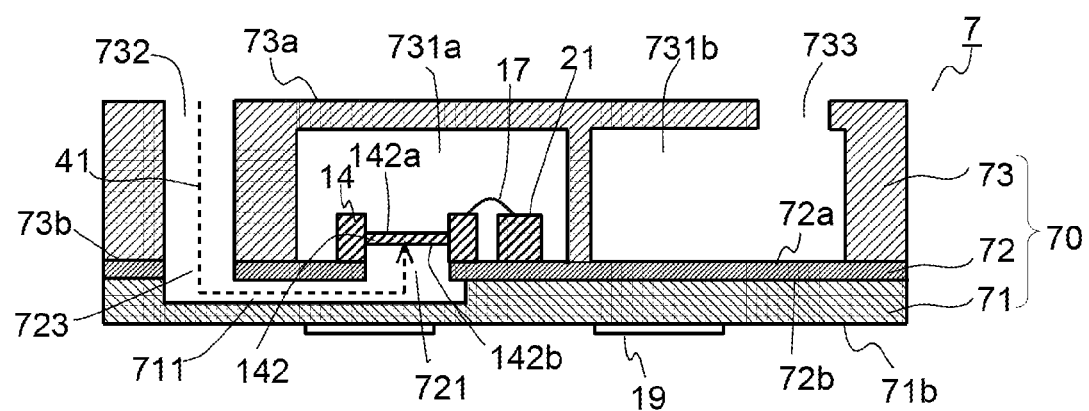
FIG. 18A A schematic cross-sectional view showing the configuration of the microphone unit of the fifth embodiment, a schematic cross-sectional view in the position C-C of FIG. 17A.
Figure 18B:
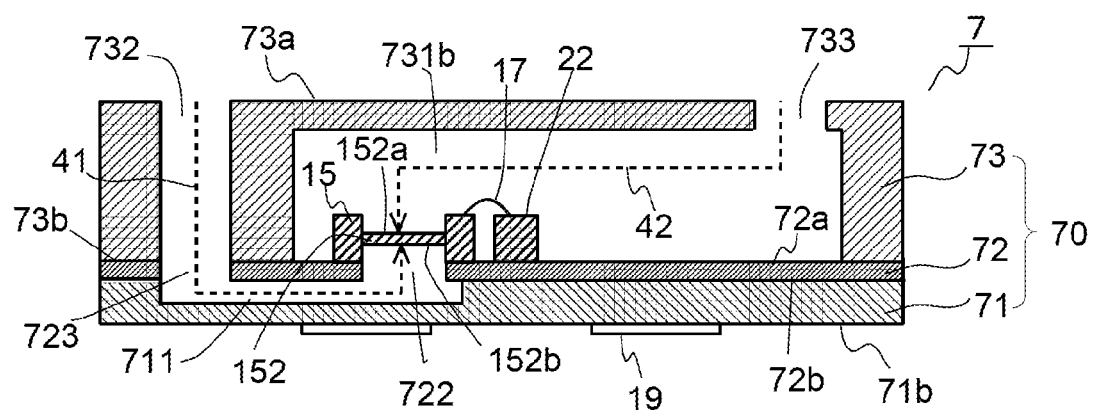
FIG. 18B A schematic cross-sectional view showing the configuration of the microphone unit of the fifth embodiment, a schematic cross-sectional view in the position D-D of FIG. 17A.

FIGS. 17A, 17B, and 17C are schematic plan views of the members constituting the microphone unit of the fifth embodiment as seen from above, wherein FIG. 17A is a view of the lid as seen from above, FIG. 17B is a view of microphone substrate on which the MEMS chips and ASICs are installed as seen from above, and FIG. 17C is a view of the base as seen from above. FIGS. 18A and 18B are schematic cross-sectional views showing the configuration of the microphone unit of the fifth embodiment, wherein FIG. 18A is a schematic cross-sectional view in the position C-C of FIG. 17A (a cross-sectional view of a case assuming a state in which the members of FIGS. 17A to 17C are stacked), and FIG. 18B is a schematic cross-sectional view in the position D-D of FIG. 17A.

A first groove part 711 having a substantially rectangular shape in plan view is formed as shown in FIG. 17C in a base 71 having a substantially rectangular shape in plan view, near one end in the longitudinal direction of a top surface 71a thereof (near the left in FIG. 17C). The shape of the first groove part 711 is one example and can be suitably modified. For example, two grooves having a substantial T shape in plan view such as the one shown in FIG. 3C may be shaped so as to be aligned in the transverse direction of the base 71.

In a microphone substrate 72 having a substantially rectangular shape in plan view, near the center of a top surface 72a thereof, are formed a first open part 721 covered by the first MEMS chip 14, and a second open part 722 covered by the second MEMS chip 15, as shown in FIGS. 17B, 18A, and 18B. The first open part 721 and the second open part 722 are disposed so as to be aligned in the transverse direction of the microphone substrate 72. A third open part 723 is formed near one end in the longitudinal direction of the top surface 72a of the microphone substrate 72 (the same side on which the first groove part 711 of the base 71 is formed).

The first open part 721 and the second open part 722 are composed of through-holes having substantially circular shapes in plan view, and when the microphone substrate 72 is stacked on the base 71, the open parts are positioned so as to overlap with the first groove part 711 formed in the base 71. The third open part 723 is composed of a through-hole having a substantially rectangular shape in plan view whose longitudinal direction is the transverse direction of the microphone substrate 72 (the up-down direction of FIG. 17B). The third open part 723 is also positioned and sized so as to overlap with the first groove part 711 formed in the base 71.

In the present embodiment, the two ASICs 21, 22 are disposed so as to be aligned with the MEMS chips 14, 15 respectively in the longitudinal direction of the microphone substrate 72, but their positions may be suitably modified.

A lid 73 is formed into the shape of a substantial parallelepiped, and formed therein as shown in FIG. 17A are a first concave space 731a having a substantially rectangular shape in plan view, and a second concave space 731b having a substantial L shape in plan view. By placing the lid 73 over the microphone substrate 72, a first accommodating space for accommodating the first MEMS chip 14 and the first ASIC 21 is obtained between the first concave space 731a and the microphone substrate 72, and a second accommodating space for accommodating the second MEMS chip 15 and the second ASIC 22 is obtained between the second concave space 731b and the microphone substrate 72.

In the lid 73, a first sound hole 732 is formed in one end of the longitudinal direction, and a second sound hole 733 is formed in the other end in the longitudinal direction. The first sound hole 732 is a through-hole passing through from a top surface 73a of the lid 73 to a bottom surface 73b and having a substantially elliptical shape in plan view, and when the lid 73 is placed over the microphone substrate 72, the position of the first sound hole 732 is adjusted so that the sound hole is communicated with the third open part 723 formed in the microphone substrate 72. The second sound hole 733 having a substantially elliptical shape in plan view is communicated with the second concave space 731b of the lid 73.

The base 71, microphone substrate 72 (on which the two MEMS chips 14, 15 and two ASICs 21, 22 are mounted), and lid 73 described above are stacked sequentially in the stated order from the bottom and co-affixed using an adhesive or the like, for example, between the members, whereby a microphone unit 7 such as the one shown in FIGS. 18A and 18B is obtained. In the microphone unit 7, acoustic waves inputted from the exterior via the first sound hole 732 pass through the third open part 723, a hollow space (the space formed using the first groove part 711 of the base 71 and the bottom surface 72b of the microphone substrate 72), and the first open part 721 to reach the bottom surface 142b of the first diaphragm 142 (see FIG. 18A), and also pass through the third open part 723, the aforementioned hollow space, and the second open part 722 to reach the bottom surface 152b of the second diaphragm 152 (see FIG. 18B). Acoustic waves inputted from the exterior via the second sound hole 733 pass through the second accommodating space (the space formed between the second concave space 731b of the lid 73 and the top surface 72a of the microphone substrate 72) to reach the top surface 152a of the second diaphragm 152 (see FIG. 18B).

In other words, a case 70 of the microphone unit 7 is provided with a first sound channel 41 for transmitting acoustic pressure inputted from the first sound hole 732 to one surface (the bottom surface 142b) of the first diaphragm 142 and also to one surface (the bottom surface 152b) of the second diaphragm 152, and a second sound channel 42 for transmitting acoustic pressure inputted from the second sound hole 733 to the other surface (the top surface 152a) of the second diaphragm 152. The other surface (the top surface 142a) of the first diaphragm 142 faces a sealed space (a back chamber) in which there are no acoustic leaks, this space being formed using the second accommodating space (the space formed between the first concave space 731a of the lid 73 and the top surface 72a of the microphone substrate 72).

The microphone unit 7 of the fifth embodiment is also configured comprising both a function as a bidirectional differential microphone having excellent distant noise suppression performance (obtained by using the signals extracted from the second MEMS chip 15), and a function as an omnidirectional microphone capable of picking up faraway sounds (obtained by using signals extracted from the first MEMS chip 14). Therefore, the microphone unit 7 of the fifth embodiment is also readily adapted to imparting multifunctional capabilities to the voice input device in which the microphone unit is applied. In the case of the present embodiment, the back chamber capacity in the first MEMS chip 14 is easily increased, and microphone sensitivity when the first MEMS chip 14 is used is readily improved.

When the configuration of the fifth embodiment is employed, the number of ASICs may be one. Similar to the configuration of the fourth embodiment, a coating layer CL may be provided to the interiors of some or the sound channels and the lid 73 to take dust countermeasures when the configuration of the fifth embodiment is employed as well.

6. Microphone Unit of Sixth Embodiment

Next, the microphone unit of the sixth embodiment will be described. Similar to the microphone unit 7 of the fifth embodiment, the microphone unit of the sixth embodiment is configured having two MEMS chips 14, 15 and two ASICs 21, 22, wherein the first MEMS chip 14 and the second MEMS chip 15 are accommodated in separate spaces. In the fifth embodiment, the two MEMS chips 14, 15 are disposed so as to be aligned in the transverse direction of the microphone substrate 72, but in the sixth embodiment, the MEMS chips 14, 15 are disposed so as to be aligned in the longitudinal direction of the microphone substrate. This difference is the focus of the description hereinbelow. Portions duplicated from the microphone unit 7 of the fifth embodiment are referenced with the same symbols, and descriptions thereof are omitted when a description is not particularly necessary.

Figure 19A:
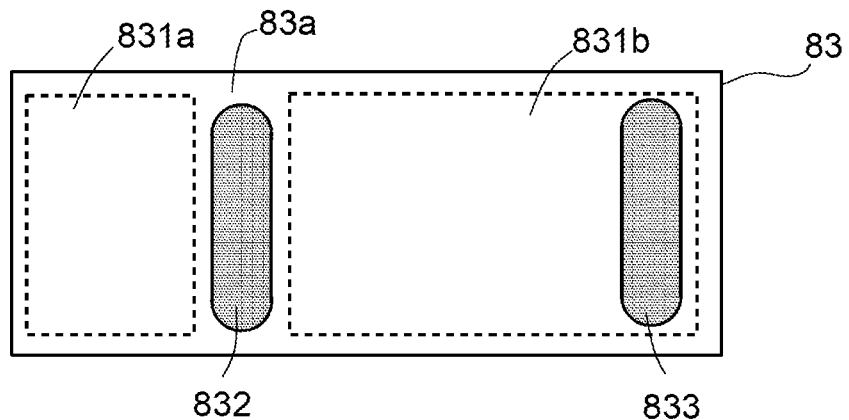
FIG. 19A A schematic plan view of the lid constituting the microphone unit of the sixth embodiment as seen from above.
Figure 19B:
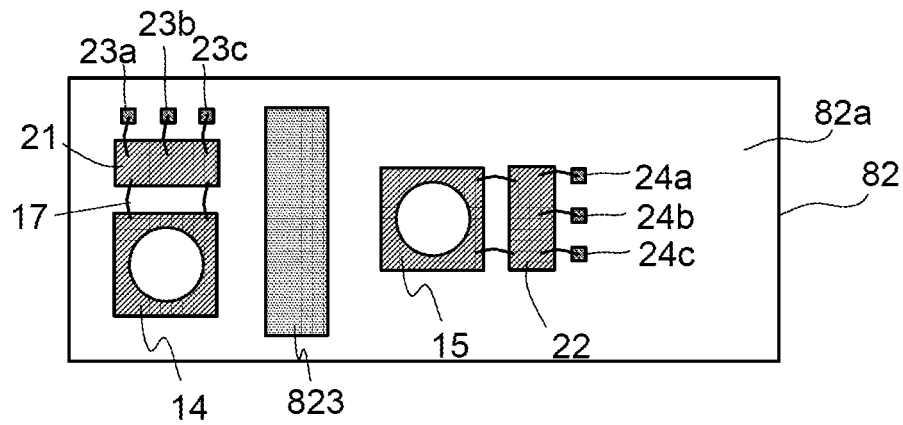
FIG. 19C A schematic plan view of the base constituting the microphone unit of the sixth embodiment as seen from above.
Figure 19C:
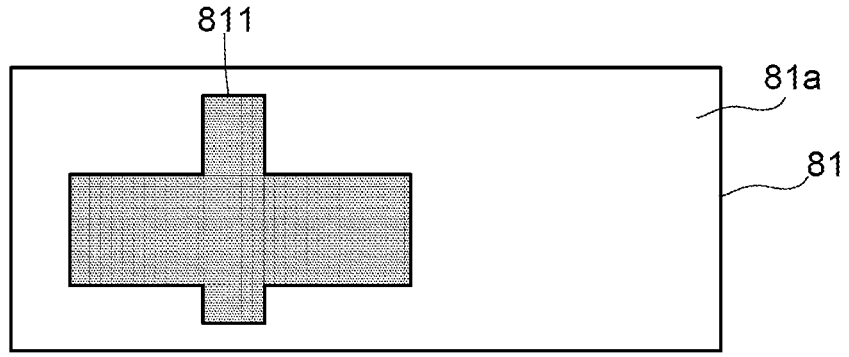
Figure 20:
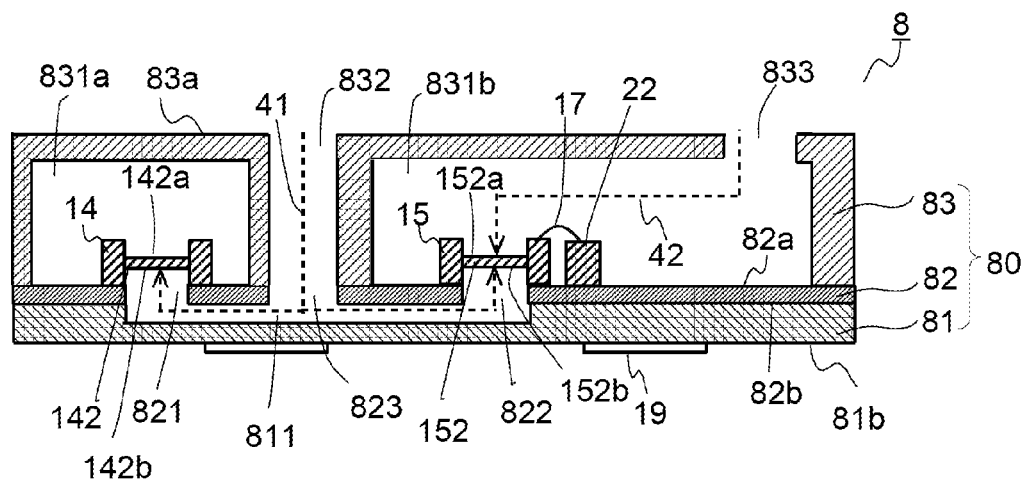
FIG. 20 A schematic cross-sectional view showing the configuration of the microphone unit of the sixth embodiment.

FIGS. 19A, 19B, and 19C are schematic plan views of the members constituting the microphone unit of the sixth embodiment as seen from above, wherein FIG. 19A is a view of the lid as seers from above, FIG. 19B is a view of a microphone substrate on which the MEMS chips and ASICs are installed as seen from above, and FIG. 19C is a view of the base as seen from above. FIG. 20 is a schematic cross-sectional view showing the configuration of the microphone unit of the sixth embodiment (a cross-sectional view sectioned in the same position as FIG. 4).

In a base 81 having a substantially rectangular shape in plan view, a first groove part 811 substantially having a cross shape in plan view is formed in a position slightly shifted from the middle part (shifted in the longitudinal direction) of a top surface 81a of the base, as shown in FIG. 19C. The shape of the first groove part 811 is one example and can be suitably modified. For example, the shape may be substantially rectangular or another shape in plan view.

In a microphone substrate 82 having a substantially rectangular shape in plan view, in a top surface 82a thereof, are formed a first open part 821 covered by the first MEMS chip 14, and a second open part 822 covered by the second MEMS chip 15, as shown in FIGS. 19 and 20. The first open part 821 and the second open part 822 are disposed so as to be aligned in the longitudinal direction of the microphone substrate 82. A third open part 823 is formed in the top surface 82a of the microphone substrate 82 so as to be between the first open part 821 and the second open part 822.

When the microphone substrate 82 is stacked on the base 81, the first open part 821 composed of a through-hole having a substantially circular shape in plan view is positioned so as to overlap one end side (the left side in FIGS. 19C and 20) of the longitudinally extending portion of the first groove part 811 formed in the base 81. When the microphone substrate 82 is stacked on the base 81, the second open part 822 composed of a through-hole having a substantially circular shape in plan view is positioned so as to overlap the other end side (the right side in FIGS. 19C and 20) of the longitudinally extending portion of the first groove part 811 formed in the base 81. The third open part 823 is composed of a through-hole having a substantially rectangular shape in plan view whose longitudinal direction is the transverse direction of the microphone substrate 82 (the up-down direction of FIG. 19B). The third open part 823 is also positioned and sized so as to overlap with the transversely extending portion of the first groove part 811 formed in the base 81.

In the present embodiment, the first ASIC 21 is disposed so as to be aligned with the first MEMS chip 14 in the transverse direction of the microphone substrate 82 and the second ASIC 22 is disposed so as to be aligned with the second MEMS chip 15 in the longitudinal direction of the microphone substrate 82, but these positions may be suitably modified.

A lid 83 is formed into the shape of a substantial parallelepiped, and formed therein as shown in FIG. 19A are a first concave space 831a having a substantially rectangular shape in plan view, and a second concave space 831b having a substantially rectangular shape in plan view. By placing the lid 83 over the microphone substrate 82, a first accommodating space for accommodating the first MEMS chip 14 and the first ASIC 21 is obtained between the first concave space 831a and the microphone substrate 82, and a second accommodating space for accommodating the second MEMS chip 15 and the second ASIC 22 is obtained between the second concave space 831b and the microphone substrate 82.

In the lid 83, a first sound hole 832 is formed between the first concave space 831a and the second concave space 831b, and a second sound hole 833 is formed in one end in the longitudinal direction (the end on the side where the second concave space 831b is provided). The first sound hole 832 is a through-hole passing through from a top surface 83a of the lid 83 to a bottom surface 83b and having a substantially elliptical shape in plan view, and when the lid 83 is placed over the microphone substrate 82, the position of the first sound hole 832 is adjusted so that the sound hole is communicated with the third open part 823 formed in the microphone substrate 82. The second sound hole 833 having a substantially elliptical shape in plan view is communicated with the second concave space 831b of the lid 83.

The base 81, microphone substrate 82 (on which the two MEMS chips 14, 15 and two ASICs 21, 22 are mounted), and lid 83 described above are stacked sequentially in the stated order from the bottom and co-affixed using an adhesive or the like, for example, between the members, whereby a microphone unit 8 such as the one shown in FIG. 20 is obtained. In the microphone unit 8, acoustic waves inputted from the exterior via the first sound hole 832 pass through the third open part 823, a hollow space (the space formed using the first groove part 811 of the base 81 and the bottom surface 82b of the microphone substrate 82), and the first open part 821 to reach the bottom surface 142b of the first diaphragm 142, and also pass through the third open part 823, the aforementioned hollow space, and the second open part 822 to reach the bottom surface 152b of the second diaphragm 152. Acoustic waves inputted from the exterior via the second sound hole 833 pass through the second accommodating space (the space formed between the second concave space 831b of the lid 83 and the top surface 82a of the microphone substrate 82) to reach the top surface 152a of the second diaphragm 152.

In other words, a case 80 of the microphone unit 8 is provided with a first sound channel 41 for transmitting acoustic pressure inputted from the first sound hole 832 to one surface (the bottom surface 142b) of the first diaphragm 142 and also to one surface (the bottom surface 152b) of the second diaphragm 152, and a second sound channel 42 for transmitting acoustic pressure inputted from the second sound hole 833 to the other surface (the top surface 152a) of the second diaphragm 152. The other surface (the top surface 142a) of the first diaphragm 142 faces a sealed space (a back chamber) in which there are no acoustic leaks, this space being formed using the second accommodating space (the space formed between the first concave space 831a of the lid 83 and the top surface 82a of the microphone substrate 82).

The microphone unit 8 of the sixth embodiment is also configured comprising both a function as a bidirectional differential microphone having excellent distant noise suppression performance (obtained by using the signals extracted from the second MEMS chip 15), and a function as an omnidirectional microphone capable of picking up faraway sounds (obtained by using signals extracted from the first MEMS chip 14). Therefore, the microphone unit 8 of the sixth embodiment is also readily adapted to imparting multifunctional capabilities to the voice input device in which the microphone unit is applied. In the case of the present embodiment, the back chamber capacity in the first MEMS chip 14 is easily increased, and microphone sensitivity when the first MEMS chip 14 is used is readily improved.

When the configuration of the sixth embodiment is employed, the number of ASICs may be one. Similar to the configuration of the fourth embodiment, a coating layer CL may be provided to the interiors of some of the sound channels and the lid 83 to take dust countermeasures when the configuration of the sixth embodiment is employed as well.

(Voice Input Device to which the Microphone Unit of the Present Invention is Applied)

The following is a description of an example of a configuration of the voice input device to which the microphone unit of the present invention is applied. A case in which the voice input device is a mobile telephone is described as an example. Also described as an example is a case in which the microphone unit is the microphone unit of the first embodiment.

Figure 21:
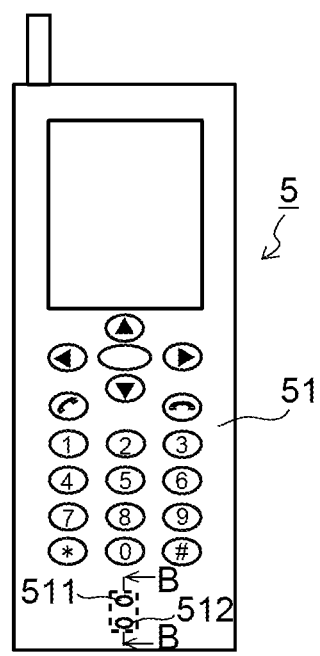
FIG. 21 A drawing showing the schematic configuration of an embodiment of a mobile telephone to which the microphone unit of the first embodiment is applied.
Figure 22:
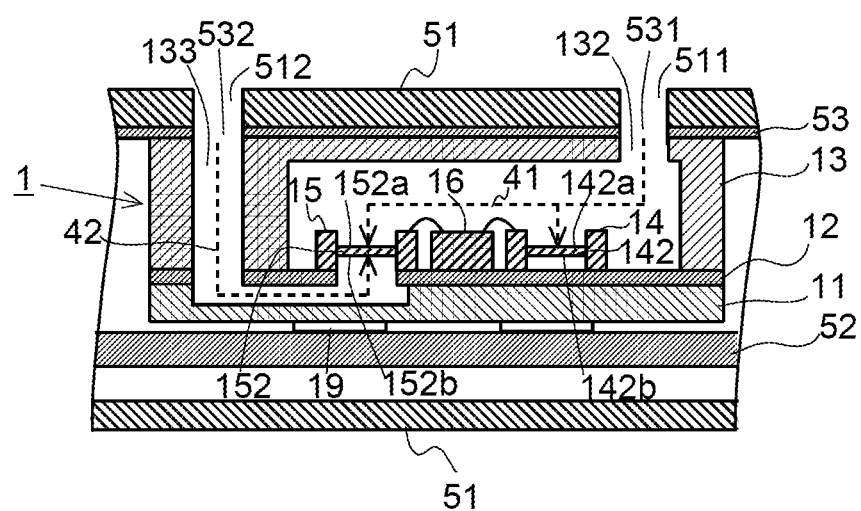
FIG. 22 A schematic cross-sectional view in the position B-B of FIG. 21.

FIG. 21 is a drawing showing the schematic configuration of an embodiment of a mobile telephone to which the microphone unit of the first embodiment is applied. FIG. 22 is a schematic cross-sectional view in the position B-B of FIG. 21. Two sound holes 511, 512 are provided in the bottom part side of a case 51 of the mobile telephone 5 as shown in FIG. 21, and the user's voice is inputted via these two sound holes 511, 512 to the microphone unit 1 which is disposed inside the case 51.

The microphone unit 1 is disposed so that the first sound hole 132 overlaps the sound hole 511 formed in the case 51 of the mobile telephone 5, and the second sound hole 133 overlaps the sound hole 512 formed in the case 51 of the mobile telephone 5. Therefore, a voice occurring outside of the case 51 of the mobile telephone 5 passes through the first sound channel 41 of the microphone unit 1 to reach the top surface 142a of the first diaphragm 142 of the first MEMS chip 14. The voice occurring outside of the case 51 of the mobile telephone 5 also passes through the first sound channel 41 of the microphone unit 1 to reach the top surface 152a of the second diaphragm 152 of the second MEMS chip 15, and passes through the second sound channel 42 to reach the bottom surface 152b of the second diaphragm 152 of the second MEMS chip 15.

In the mobile telephone 5 of the present embodiment, an elastic body (a gasket) 53 is disposed between the case 51 and the microphone unit 1. Openings 531, 532 are formed in the elastic body 53 so that voices occurring outside of the case 51 are inputted independently and efficiently corresponding to the two sound channels 41, 42 provided to the microphone unit 1. The elastic body 53 is provided so as to ensure airtightness without any acoustic leaks.

The microphone unit 1 is mounted on a mounting substrate 52 provided inside the case 51 of the mobile telephone 5, as shown in FIG. 22. The mounting substrate 52 is provided with a plurality of electrode pads electrically connected with the plurality of external connecting electrodes 19 of the microphone unit 1, and the microphone unit 1 is mounted to the mounting substrate 52 using soldering or the like, for example. Thereby, a power source voltage is provided to the microphone unit 1, and electrical signals outputted from the microphone unit 1 are sent to a voice signal processor (not shown) provided on the mounting substrate 52.

During a close-talking mode, for example, the voice signal processor performs processing using the signals that correspond to the second MEMS chip 15 from among the signals outputted from the microphone unit 1. During a hands-free mode or a video record mode, for example, the processor performs processing using the signals that correspond to the first MEMS chip 14 from among the signals outputted from the microphone unit 1. The preferred signals processing can thereby be performed in each mode. It is preferable that switching between the close-talking mode and the hands-free mode (and/or the video record mode) can be performed by providing a button for mode switching (an input part) to the mobile telephone 5, for example. The mode information selected by this input part is configured so as to be outputted to the voice signal processor, whereby signal processing appropriately corresponding to each mode can be carried out.

When the microphone unit 2 of the second embodiment is applied to the mobile telephone 5, during the close-talking mode, for example, a switch signal notifying of this mode is inputted to the microphone unit 2. Therefore, due to the workings of the switch circuit 164, a signal corresponding to the second MEMS chip 15 is outputted from the microphone unit 2, and the voice signal processor performs processing using the signal corresponding to the second MEMS chip 15. During the hands-free mode or the video record mode, for example, due to the workings of the switch circuit 164 to which the switch signal has been inputted, a signal corresponding to the first MEMS chip 14 is outputted from the microphone unit 2, and the voice signal processor performs processing using the signal corresponding to the first MEMS chip 14. The preferred signal processing can thereby be performed in each mode.

Figure 23:
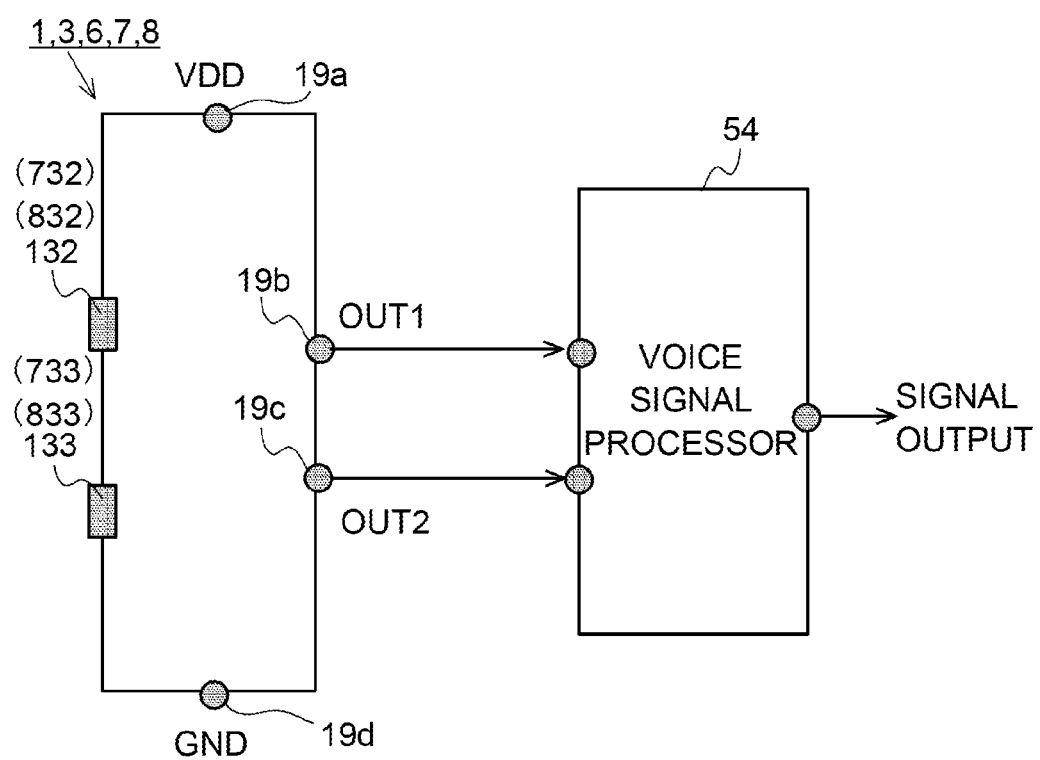
FIG. 23 A block diagram for illustrating a modification of the voice input device of the embodiments.

The microphone unit applied to the mobile telephone 5 is configured in the same manner as in the first or third through sixth embodiments, and in cases in which both signals corresponding to the first MEMS chip 14 and signals corresponding to the second MEMS chip 15 are outputted from the microphone units 1, 3, 6, 7, 8 (see FIG. 23), addition, subtraction, or filtering using both signals may be performed in a voice signal processor 54.

Performing such processes makes it possible to control the directional characteristics of the voice input device and to pick up voices in specified areas. For example, omnidirectional, hypercardioid, supercardioid, unidirectional, and any other desired directional characteristics can be achieved.

The process for controlling the directional characteristics is herein a configuration performed by the voice input device, but the configuration may have a processor, capable of performing the process for controlling the directional characteristics, provided to the ASIC 16 of the microphone units 1, 3, for example.

(Other)

The microphone units 1, 2, 3, 6, 7, 8 and the voice input device 5 shown above exemplify the embodiments of the present invention, and the range of application of the present invention is not limited to the embodiments shown above. Specifically, various modifications may be made to the embodiments described above within a range that does not deviate from the objects of the present invention.

Figure 24A:
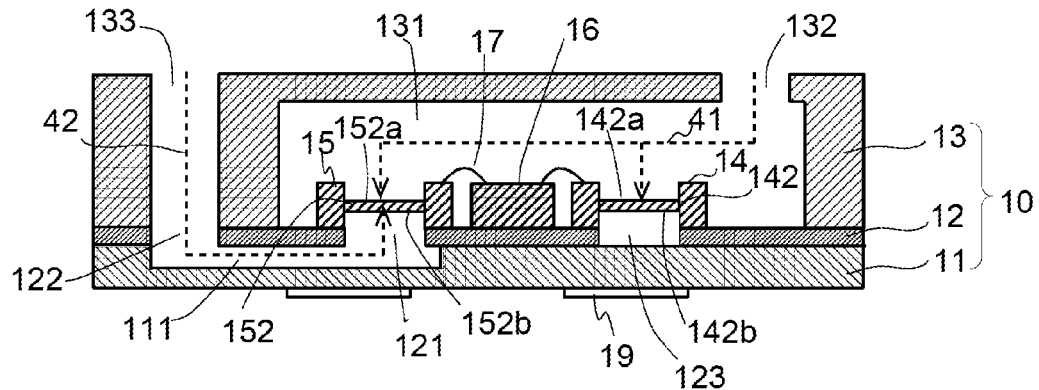
FIG. 24A A schematic cross-sectional view for illustrating a modification of the microphone unit of the embodiments.
Figure 24B:
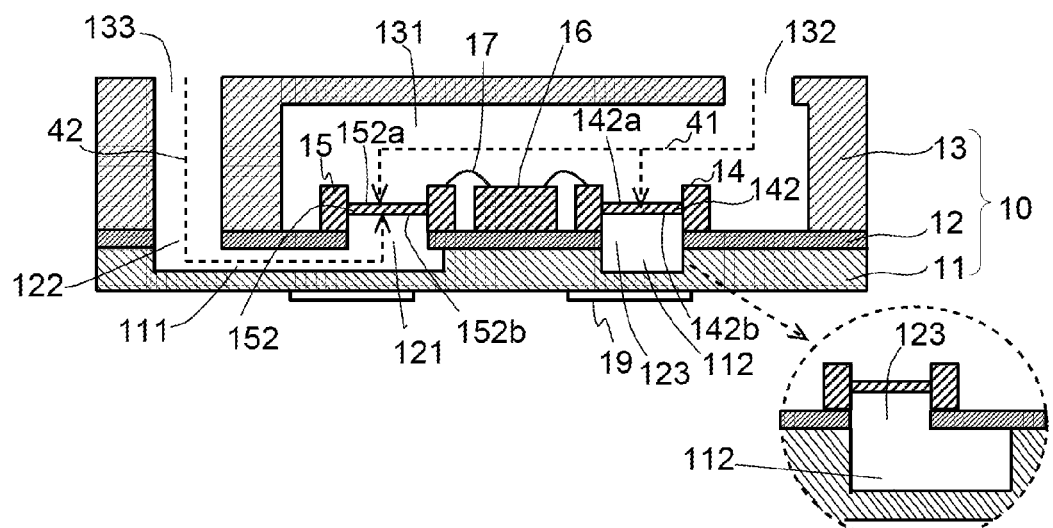
FIG. 24B A schematic cross-sectional view for illustrating another modification of the microphone unit of the embodiments.
Figure 24C:
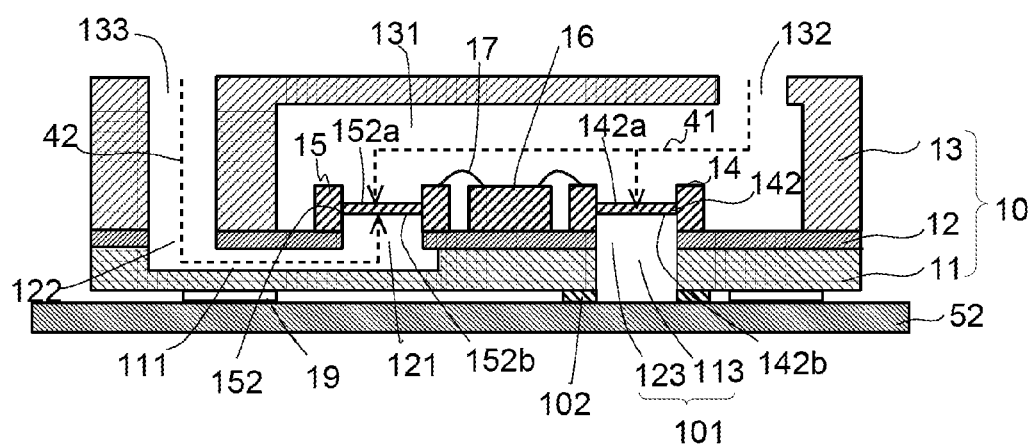
FIG. 24C A schematic cross-sectional view for illustrating yet another modification of the microphone unit of the embodiments.

For example, the microphone units 1, 2, 3, 6 shown above may be modified to any of the configurations shown in FIGS. 24A, 24B, and 24C. Specifically, the first MEMS chip 14 may be disposed so as to obscure the top surface of a through-hole 123 provided to the microphone substrate 12 and having a substantially circular shape in plan view, as shown in FIG. 24A. Such a configuration widens the airtight space (the back chamber) underneath the bottom surface 142b of the first diaphragm 142, and the microphone sensitivity of the first MEMS chip 14 therefore improves. The through-hole 123 provided to the microphone substrate 12 is an embodiment of the groove part provided to the installation part composed of the base II and the microphone substrate 12 of the present invention, and the top surface of the through-hole 123 is an embodiment of the open surface of the groove part of the present invention.

The first MEMS chip 14 may be disposed so as to obscure the through-hole 123 provided to the microphone substrate 12 and having a substantially circular shape in plan view; and also a groove part 112 provided to the base 11 so as to be communicated with the through-hole 123 and having a substantially circular shape in plan view, as shown in FIG. 24B. Such a configuration further widens (compared with FIG. 24A) the airtight space (the back chamber) underneath the bottom surface 142b of the first diaphragm 142, and the microphone sensitivity of the first MEMS chip 14 can therefore be further improved. It is more preferable that the open surface area of the groove part 112 provided to the base 11 be greater than the open surface area of the through-hole 123, as shown inside the dashed-line circle in FIG. 24B. The through-hole 123 provided to the microphone substrate 12 and the groove part 112 provided to the base II are embodiments of the groove part provided to the installation part composed of the base 11 and the microphone substrate 12 of the present invention, and the top surface of the through-hole 123 is an embodiment of the open surface of the groove part of the present invention.

A through-hole 101 passing through the microphone substrate 12 and the base 11 (the installation part) and having a substantially circular shape in plan view may be provided (a combination of the through-hole 123 passing through the microphone substrate 12 and the through-hole 113 passing through the base 11), one opening of which may be obscured by the first MEMS chip 14, and the other opening of which may be obscured and sealed off by the mounting substrate 52 on which the microphone unit 1, 2, 3, 6 is mounted, as shown in FIG. 24C. Such a configuration further widens (compared with FIGS. 24A and 24B) the airtight space (the back chamber) underneath the bottom surface 142b of the first diaphragm 142, and the microphone sensitivity of the first MEMS chip 14 can therefore be further improved.

In this case, an airtight holding part 102 must be provided so as to enclose the periphery of the through-hole 101 underneath the bottom surface 11b of the base 11, maintaining the airtightness of the back chamber. The airtight holding part 102 can be a soldered bonded part provided so as to enclose the periphery of the through-hole 101, for example. This makes it possible to ensure airtightness in the back chamber by a soldering bonding process when the microphone unit 1, 2, 3, 6 is mounted on the mounting substrate 52.

In the microphone units of the first and sixth embodiments, the first groove parts 111 of the bases 11, 81 are substantially T-shaped or cross-shaped in plan view, but the reason for this is to ensure greater surface area in the opening of the portion serving as the sound entrance (the second sound hole 133 or the first sound hole 832), and to reduce the capacity of the second sound channel 42 or the first sound channel 41. Thereby, the acoustic resonance frequency of the second sound channel 42 or the first sound channel 41 can be set to a higher frequency, and the microphone characteristics can be made satisfactory.

Herein is a supplementary description of the resonance frequency. Commonly, in the case of a model including both an acoustic space (a sound channel) and a sound entrance joined to this space, an acoustic resonance frequency unique to the model is maintained. This resonance is referred to a Helmholtz resonance. Qualitatively, the greater the sound entrance surface area S and the smaller the volume V of the acoustic space, the higher the resonance frequency; and the smaller the sound entrance surface area S and the greater the volume V of the acoustic space, the lower the resonance frequency. When the resonance frequency decreases and approaches the voice frequency band (approximately 10 kHz), it has an adverse effect on the frequency characteristics and sensitivity characteristics of the microphone. Consequently, the resonance frequency is preferably set as high as possible.

In the above description, the second sound channel 42 or first sound channel 41 is substantially T-shaped or cross-shaped in plan view but is not limited to such a shape, and the second sound channel 42 or first sound channel 41 is prefer- ably designed according to the placement of the MEMS chips and ASIC so that the spatial capacity of the sound channel is at a minimum.

In the embodiments shown above, the first diaphragm and second diaphragm of the present invention are configured as MEMS chips 14, 15 formed using semiconductor manufacturing techniques, but are not limited to such a configuration. For example, the first diaphragm and/or the second diaphragm may be a capacitor microphone or the like that uses an electret film.

In the embodiments described above, so-called capacitor type microphones are employed as the configurations of the first diaphragm and second diaphragm of the present invention. However, the present invention can also be applied to a microphone unit that employs a configuration other than that of a capacitor type microphone. For example, the present invention can also be applied to a microphone unit in which an electromotive (dynamic), electromagnetic (magnetic), piezoelectric, or other type of microphone or the like is employed.

In the embodiments described above, the ASICs 16, 21, 22 (electrical circuit parts) are configured as being included inside the microphone units 1, 2, 3, 6, 7, 8, but the electrical circuit parts may be disposed outside of the microphone units. In the embodiments described above, the MEMS chips 14, 15 and the ASICs 16, 21, 22 are configured from separate chips, but the integrated circuit installed on the ASIC may be formed as a monolithic integrated circuit on the silicon substrate where the MEMS chips are formed.

In addition, the shape of the microphone unit is not limited to the shape of the present embodiment, and can of course be modified to various other shapes.

INDUSTRIAL APPLICABILITY

The microphone unit of the present invention can be suitably used for a mobile telephone, for example.

LIST OF REFERENCE SIGNS 1, 2, 3, 6, 7, 8 Microphone unit
5 Mobile telephone (voice input device)
10, 70, 80 Case
11, 71, 81 Base (part of case, part of installation part)
12, 72, 82 Microphone substrate (part of case, part of installation part)
13, 73, 83 Lid
14 First MEMS chip (first vibrating part)
15 Second MEMS chip (second vibrating part)
16 ASIC (electrical circuit part)
19e Switching electrode
21 First ASIC (first electrical circuit part)
22 Second ASIC (second electrical circuit part)
41 First sound channel
42 Second sound channel
101 Through-hole (through-hole formed in installation part)
111, 711, 811 First groove part (configurational element of hollow space)
112 Groove part (configuration element of groove part formed in installation part)
121, 721, 821 First open part
122, 722, 822 Second open part
123 Through-hole (configurational element of groove part formed in installation part)
131 Concave space (configurational element of accommodating space)
132, 732, 832 First sound hole 133, 733, 833 Second sound hole
142 First diaphragm
142a Top surface (one surface) of first diaphragm
152 Second diaphragm
152a Top surface (one surface) of second diaphragm
152b Bottom surface (other surface) of second diaphragm
164 Switch circuit
723, 823 Third open part
731a, 831a First concave space (configurational element of first accommodating space)
731b, 831b Second concave space (configurational element of second accommodating space)
S Sealed space

We claim:

1. A microphone unit comprising:
an installation part including an installation surface on which a first diaphragm and a second diaphragm are installed; and
a lid placed over the installation surface, the lid covering the first and second diaphragms and having formed therein a first sound hole and a second sound hole;
wherein a case formed by the use of the installation part and the lid is provided with:
a first sound channel for transmitting acoustic waves inputted from the first sound hole to one surface of the first diaphragm and to one surface of the second diaphragm;
a second sound channel for transmitting acoustic waves inputted from the second sound hole to the other surface of the second diaphragm; and
a sealed space that faces the other surface of the first diaphragm;
and further wherein:
the installation part has formed therein a first open part, a second open part, and a hollow space in communication with the first open part and the second open part; and
the lid has formed therein the first sound hole, the second sound hole, and an accommodating space that communicates with the first sound hole and in which the first and second diaphragms are accommodated; and
wherein:
the second diaphragm is disposed over the first open part;
the first sound channel is formed using the first sound hole and the accommodating space; and
the second sound channel is formed using the second sound hole, the second open part, the hollow space, and the first open part.

2. The microphone unit according to claim 1, wherein the sealed space includes a space formed between the first diaphragm and the installation surface of the installation part.

3. The microphone unit according to claim 2, wherein:
the sealed space further includes a space of a groove part formed in the installation part.

4. The microphone unit according to claim 2, wherein the sealed space further includes a through-hole which is formed in the installation part and of which an opening at one side is covered by a mounting substrate.

5. The microphone unit according to claim 1, wherein the installation part includes:
a base; and
a microphone substrate on which the first diaphragm and the second diaphragm are installed, the microphone substrate being stacked on the base.

6. The microphone unit according to claim 1, comprising:
a first electrical circuit for processing an electrical signal obtained by vibration of the first diaphragm, and
a second electrical circuit part for processing an electrical signal obtained by vibration of the second diaphragm.

7. The microphone unit according to claim 1, comprising one electrical circuit for processing electrical signals obtained by vibration of the first and second diaphragms.

8. The microphone unit according to claim 7, wherein the electrical circuit is disposed so as to be between the first diaphragm and the second diaphragm.

9. The microphone unit according to claim 7, wherein the electrical circuit separately outputs a signal corresponding to the first diaphragm and a signal corresponding to the second diaphragm.

10. The microphone unit according to claim 7, wherein a switching electrode for inputting an external switch signal is provided; and
the electrical circuit includes a switch circuit for performing a switching action on the basis of the switch signal.

11. The microphone unit according to claim 10, wherein the switch circuit performs the switching action on the basis of the switch signal so as to output either the signal corresponding to the first diaphragm or the signal corresponding to the second diaphragm.

12. The microphone unit according to claim 10, wherein the electrical circuit separately outputs a signal corresponding to the first diaphragm and a signal corresponding to the second diaphragm.

13. A voice input device comprising the microphone unit according to claim 1.

14. A microphone unit comprising:
an installation part including an installation surface on which a first diaphragm and a second diaphragm are installed; and
a lid placed over the installation surface, the lid covering the first and second diaphragms and having formed therein a first sound hole and a second sound hole;
wherein a case formed by the use of the installation part and the lid is provided with:
a first sound channel for transmitting acoustic waves inputted from the first sound hole to one surface of the first diaphragm and to one surface of the second diaphragm;
a second sound channel for transmitting acoustic waves inputted from the second sound hole to the other surface of the second diaphragm; and
a sealed space that faces the other surface of the first diaphragm;
and further wherein:
the installation part has formed therein a first open part, a second open part, a third open part, and a hollow space in communication with the first open part, the second open part, and the third open part; and
the lid has formed therein the first sound hole, the second sound hole, a first accommodating space in which the first diaphragm is accommodated, and a second accommodating space that communicates with the second sound hole and in which the second diaphragm is accommodated;
wherein:
the first diaphragm is disposed over the first open part;
the second diaphragm is disposed over the second open part;
the first sound channel is formed using the first sound hole, the third open part, the hollow space, the first open part, and the second open part;
the second sound channel is formed using the second sound hole and the second accommodating space; and
the sealed space is formed using the first accommodating space.

* * * * *